(12) United States Patent
Gray et al.

(10) Patent No.: US 11,393,389 B2
(45) Date of Patent: Jul. 19, 2022

(54) POWER LINE COMMUNICATION DRIVER CIRCUIT

(71) Applicant: Huayuan Semiconductor (Shenzhen) Limited Company, Shenzhen (CN)

(72) Inventors: Richard Landry Gray, Taipei (TW); Jyun-Long Lin, Zhubei (TW); Ping-Yuan Lin, New Taipei (TW)

(73) Assignee: Huayuan Semiconductor (Shenzhen) Limited Company, Shenzhen (CN)

( * ) Notice: Subject to any disclaimer, the term of this patent is extended or adjusted under 35 U.S.C. 154(b) by 59 days.

(21) Appl. No.: 16/933,962

(22) Filed: Jul. 20, 2020

(65) Prior Publication Data

US 2021/0343231 A1 Nov. 4, 2021

Related U.S. Application Data

(60) Provisional application No. 63/018,873, filed on May 1, 2020.

(51) Int. Cl.
| | |
|---|---|
| *G06F 3/038* | (2013.01) |
| *G09G 3/32* | (2016.01) |
| *H04B 3/54* | (2006.01) |
| *H03K 4/08* | (2006.01) |

(52) U.S. Cl.
CPC ............... *G09G 3/32* (2013.01); *H03K 4/08* (2013.01); *H04B 3/542* (2013.01); *G09G 2300/023* (2013.01); *G09G 2310/06* (2013.01); *G09G 2310/08* (2013.01); *G09G 2330/02* (2013.01); *G09G 2370/00* (2013.01)

(58) Field of Classification Search
CPC ...... G09G 3/32; G09G 2300/023; H03K 4/08; H04B 3/542
USPC ............................................................ 345/211
See application file for complete search history.

(56) References Cited

U.S. PATENT DOCUMENTS

| | | | | |
|---|---|---|---|---|
| 5,128,595 | A * | 7/1992 | Hara | H05B 39/083 |
| | | | | 315/200 A |
| 5,225,765 | A * | 7/1993 | Callahan | H02M 1/44 |
| | | | | 327/451 |
| 7,061,406 | B1 * | 6/2006 | Dally | H03M 5/12 |
| | | | | 375/288 |
| 2002/0105452 | A1 * | 8/2002 | Clapp | H03M 1/108 |
| | | | | 341/144 |
| 2019/0326267 | A1 * | 10/2019 | Han | H01L 21/76877 |

\* cited by examiner

Primary Examiner — Jonathan M Blancha
(74) Attorney, Agent, or Firm — Fenwwick & West LLP

(57) ABSTRACT

A power line communication driver circuit drives a power communication line with a power line communication signal that supplies both power and control data to a plurality of electronic devices. The power line communication driver circuit includes a ramp generator that receives an input signal encoding digital data and generates a ramp signal that switches between a low non-zero ramp voltage and a high ramp voltage to encode the digital data. The power line communication driver circuit furthermore includes a buffer circuit that receives and buffers the ramp signal to generate the power line communication signal. In one application, the power line communication driver circuit may drive a group of zone integrated circuits that include driver circuits for driving respective LED zones of a display device.

20 Claims, 16 Drawing Sheets

POWER LINE COMMUNICATION DRIVER CIRCUIT

CROSS-REFERENCE TO RELATED APPLICATIONS

This application claims the benefit of U.S. Provisional Application No. 63/018,873 filed on May 1, 2020, which is incorporated by reference in their entirety.

BACKGROUND

This disclosure relates generally to a power line communication (PLC) driver and specifically to a PLC driver suitable for driving a display device.

In power line communication, a power line communication driver provides a power line communication signal that supplies both power and data to a power line communication receiver. A DC voltage component of the power line communication signal may drive an electronic device while the data component may be extracted to control operation of the device. Power line communication can beneficially reduce the number of lines and pins needed to operate the device. However, conventional power line communication drivers are not suitable for driving large arrays of devices at high data rates because they can cause large transient current pulses that can interfere with operation.

SUMMARY

In a first embodiment, a power line communication driver circuit drives a power line communication signal. The power line communication driver circuit includes a ramp generator and a buffer circuit. The ramp generator receives an input signal encoding digital data and generates a ramp signal that switches between a low non-zero ramp voltage and a high ramp voltage to encode the digital data. The ramp generator controls an ascending slew rate of transitions from the low non-zero ramp voltage to the high ramp voltage according to a first current control signal, and controls a descending slew rate of transitions from the high ramp voltage to the low non-zero ramp voltage according to a second current control signal. The buffer circuit receives the ramp signal and buffers the ramp signal to generate the power line communication signal, which provides a power supply voltage to drive one or more electronic devices and provides the digital data to control the one or more electronic devices. The electronic devices may comprise, for example, an array of distributed driver circuits for driving LED zones of a display device, an array of sensor circuits, or a mixed array of driver and sensor circuits.

In an embodiment, the ramp generator comprises a capacitor, a controlled current circuit, and a clamping circuit. The controlled current circuit receives the input signal, the first current control signal, and the second current control signal, and causes charging of the capacitor in response to the input signal having a first input voltage level, and discharging of the capacitor in response to the input signal having a second input voltage level. The clamping circuit clamps the voltage across the capacitor between the low non-zero ramp voltage and the high ramp voltage. An output node outputs the voltage across the capacitor.

In an embodiment, the controlled current circuit includes a jitter control circuit that generates the first and second current control signals as varying signals that cause the first current source and the second current source to vary the ascending and descending slew rates based on a control waveform. The control waveform may comprise, for example, a triangle waveform, a different periodic waveform, or a non-periodic waveform.

In another embodiment, a display device includes an array of LED zones that each comprise one or more LEDs, a set of power communication lines, an array of distributed driver circuits, and a control circuit. The driver circuits each control one or more of the LED zones. The driver circuits are arranged in groups, in which each group is coupled to one of the set of power communication lines to receive a respective power line communication signal that supplies power to the driver circuits in the group and provides control data to the driver circuits in the group. The control circuit includes a plurality of power line communication driver circuits for driving the set of power communication lines. Each of the power line communication driver circuits includes a ramp generator circuit and a buffer circuit as described above. The driver circuits and corresponding zones may be implemented as zone integrated circuits in which the driver circuits and the one or more LEDs in the LED zone controlled by the driver circuit are integrated and vertically stacked over a substrate.

In another embodiment, a control circuit controls groups of distributed zone integrated circuits that each comprise one or more LEDs and a driver circuit for driving the one or more LEDs. The control circuit comprises a timing controller and a plurality of power line communication driver circuits. The timing controller receives image data and generates a plurality of timing signals each corresponding to one of the groups of distributed zone integrated circuits. The plurality of power line communication driver circuits each receives one of the timing signals and generates a power line communication signal to drive a power communication line coupled to one of the groups of distributed zone integrated circuits to supply power to the zone integrated circuits and to provide control data to the zone integrated circuits. Each of the power line communication driver circuits includes a ramp generator circuit and a buffer circuit as described above.

BRIEF DESCRIPTION OF THE DRAWINGS

The teachings of the embodiments of the present invention can be readily understood by considering the following detailed description in conjunction with the accompanying drawings.

The features and advantages described in the specification are not all inclusive and, in particular, many additional features and advantages will be apparent to one or ordinary skill in the art in view of the drawings, specification, and claims. Moreover, it should be noted that the language used in the specification has been principally selected for readability and instructional purposes, and may not have been selected to delineate or circumscribe the inventive aspect matter.

DETAILED DESCRIPTION OF EMBODIMENTS

The Figures (FIGs.) and the following description relate to the preferred embodiments of the present invention by way of illustration only. It should be noted that from the following discussion, alternative embodiments of the structures and methods disclosed herein will be readily recognized as viable alternatives that may be employed without departing from the principles of the present disclosure.

Reference will now be made in detail to several embodiments of the present invention(s), examples of which are illustrated in the accompanying figures. It is noted that wherever practicable similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the disclosure described herein.

A power line communication driver circuit drives a power communication line with a power line communication signal that supplies both power and control data to a plurality of electronic devices. The power line communication driver circuit includes a ramp generator that receives an input signal encoding digital data and generates a ramp signal that switches between a low non-zero ramp voltage and a high ramp voltage to encode the digital data. The power line communication driver circuit furthermore includes a buffer circuit that receives and buffers the ramp signal to generate the power line communication signal. In one application, the power line communication driver circuit may drive a group of zone integrated circuits that include driver circuits for driving respective LED zones of a display device.

Figure 1:
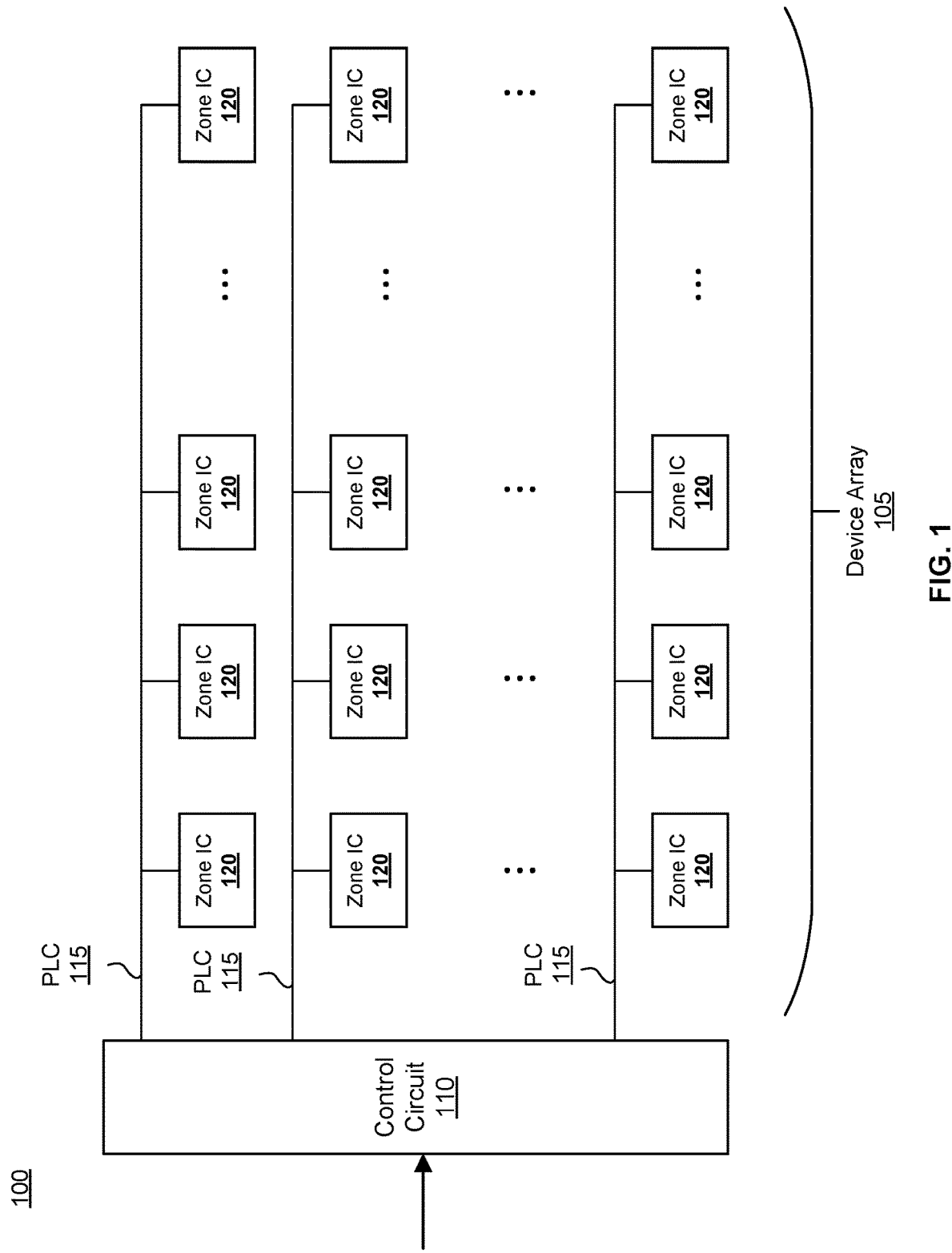
FIG. 1 is a circuit diagram illustrating an example embodiment of an electronic device that uses power line communication.

FIG. 1 is a circuit diagram of an electronic device 100 that uses power line communication. In one example embodiment, the electronic device 100 can be a display device for displaying images or video, according to one embodiment. In various embodiments, the electronic device 100 may be implemented in any suitable form-factor, including a display screen for a computer display panel, a television, a mobile device, a billboard, etc. The electronic device 100 may comprise a liquid crystal display (LCD) device or an LED display device. In an LCD display device, LEDs provide white light backlighting that passes through liquid crystal color filters that control the color of individual pixels of the display. In an LED display device, LEDs are directly controlled to emit colored light corresponding to each pixel of the display. In other embodiments, the electronic device 100 may comprise an array of sensors (e.g., temperature sensors) that may be utilized in conjunction with a display device or other device.

The electronic device 100 may include a device array 105 and a control circuit 110. In various embodiments, the electronic device 100 may include additional, fewer, or different components. The device array 105 comprises an array of zone integrated circuits (ICs) 120. In a display device the zone ICs 120 may each include one or more LEDs in an LED zone and associated driver circuitry for driving the LED zone. In some embodiments, at least some of the zone ICs 120 may instead be sensor devices such as temperature sensors. The zone ICs 120 may be arranged in a two-dimensional array (e.g., in rows and columns). In an LCD display, a zone IC 120 includes one or more LEDs that provides backlighting for a backlighting zone, which may include a one-dimensional or two-dimensional array of pixels. In an LED display, the zone IC 120 may comprise one or more LEDs corresponding to a single pixel or may comprise a one-dimensional array or two-dimensional array of LEDs corresponding to an array of pixels (e.g., one or more columns or rows). For example, in one embodiment, the zone IC 120 may comprise one or more groups of red, green, and blue LEDs that each correspond to a sub-pixel of a pixel. In another embodiment, the zone IC 120 may comprise one or more groups of red, green, and blue LED strings that correspond to a column or partial column of sub-pixels or a row or partial row of sub-pixels. For example, a zone IC 120 may comprise a set of red sub-pixels, a set of green sub-pixels, or a set of blue sub-pixels.

The LEDs of each zone IC 120 may be organic light emitting diodes (OLEDs), inorganic light emitting diodes (ILEDs), mini light emitting diodes (mini-LEDs) (e.g., having a size range between 100 to 300 micrometers), micro light emitting diodes (micro-LEDs) (e.g., having a size of less than 100 micrometers), white light emitting diodes (WLEDs), active-matrix OLEDs (AMOLEDs), transparent OLEDs (TOLEDs), or some other type of LEDs.

The power line communication (PLC) line 115 provides a PLC signal comprising a supply voltage that is modulated to encode digital control data for controlling the zone ICs 120. For example, the power line communication signal includes a DC component that supplies power to the driver circuitry of the zone ICs 120, and a modulated component that encodes control commands for controlling the zone ICs 120. In a display device, the commands may comprise, for example, brightness data for controlling brightness of the LEDs or other configuration parameters. The zone ICs 120 receive the PLC signal, apply the DC component of the PLC signal to power various circuitry of the zone IC 120 and extract the modulated component to recover and process the control data.

The zone ICs 120 may be arranged in groups that share a common PLC line 115. In the illustrated embodiment of FIG. 1, each row of the display device corresponds to a group of zone ICs 120 that shares a common PLC line 115. In other embodiments, a group of zone ICs 120 may correspond to a partial row of the device array 105 or a full or partial column of the device array 105. In another embodiment, a group of zone ICs 120 may correspond to a block of adjacent zone ICs 120 that may span multiple rows and columns.

Figure 2:
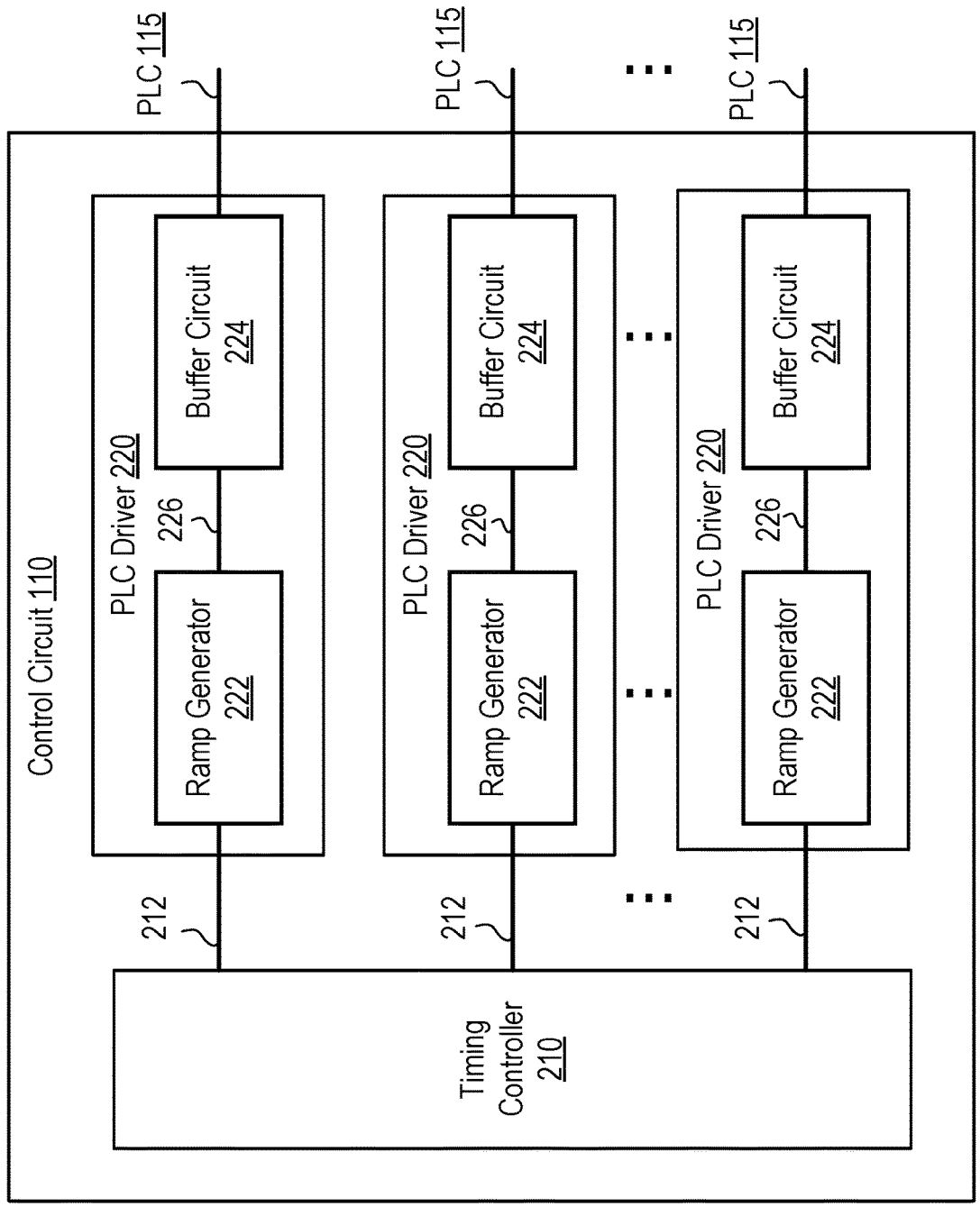
FIG. 2 is a circuit diagram illustrating an example embodiment of a control circuit for controlling a set of electronic devices using power line communication.

FIG. 2 illustrates an example embodiment of a control circuit 110. The control circuit 110 includes a timing control 210 and a set of PLC drivers 220 for driving respective PLC lines 115 each corresponding to a different group of zone ICs 120. The timing controller 210 generates respective control signals 212 encoding commands or data for communicating to the zone ICs 120. In a display device, the control signals 212 may include, for example, values for driving pixels of the display device 100, timing for driving the pixels, commands for controlling operating parameters of the zone ICs 120, requests for feedback from the zone ICs 120 or other control information. The PLC drivers 220 each drive a group of zone ICs 120 coupled to one of the PLC lines 115 based on the respective control signals 212. The PLC drivers 220 encode the respective control signals 212 as a PLC signal that is output to respective PLC lines 115 by modulating the control signal 212 onto a supply voltage.

In an embodiment, the control signals 212 and the PLC signals outputted on the PLC lines 115 are encoded using a biphase mark code encoding in which the logic values are represented by the presence or absence of transitions in each bit period. For example, periods including a transition may represent logic high values and periods without transitions may represent logic low values. In this encoding, the signal also transitions between logic levels in between each period. This encoding scheme beneficially ensures that the PLC signals on the PLC lines 115 maintain average voltages, V_avg, very close to the midpoint between the logic levels in order to provide a relatively stable DC supply voltage that can be extracted from the PLC signal to power the zone ICs 120. Another advantage of this scheme is that it does not require a separate clock signal and can be implemented on a single wire.

In an embodiment, each PLC driver circuit 220 comprises a ramp generator 222 and a buffer circuit 224. The ramp generator 222 generates a ramp signal 226 that encodes the control signal 212 by switching between a high voltage level and a low (non-zero) voltage level. For example, the ramp generator 220 may switch its output between 5.0V and 4.5V to encode the control signal 212. Alternatively, different high and low voltage levels may be used. The ramp generator 222 may also operate with a configurable slew rate that controls the rate of transition between the different voltage levels, as described in further detail below.

The buffer circuit 224 buffers the ramp signal 226 to prevent or reduce voltage drop on the PLC line 115 even when the zone ICs 120 draw significant current. In an embodiment, the buffer circuit 224 comprises a wide bandwidth, slew rate controlled buffer that operates with unity gain and can both sink and source sufficient current to drive the group of zone ICs 120. In an embodiment, the sourcing function of the buffer circuit 224 may be larger than its sinking function to meet the DC power specifications of the group of zone ICs 120.

Figure 3A:
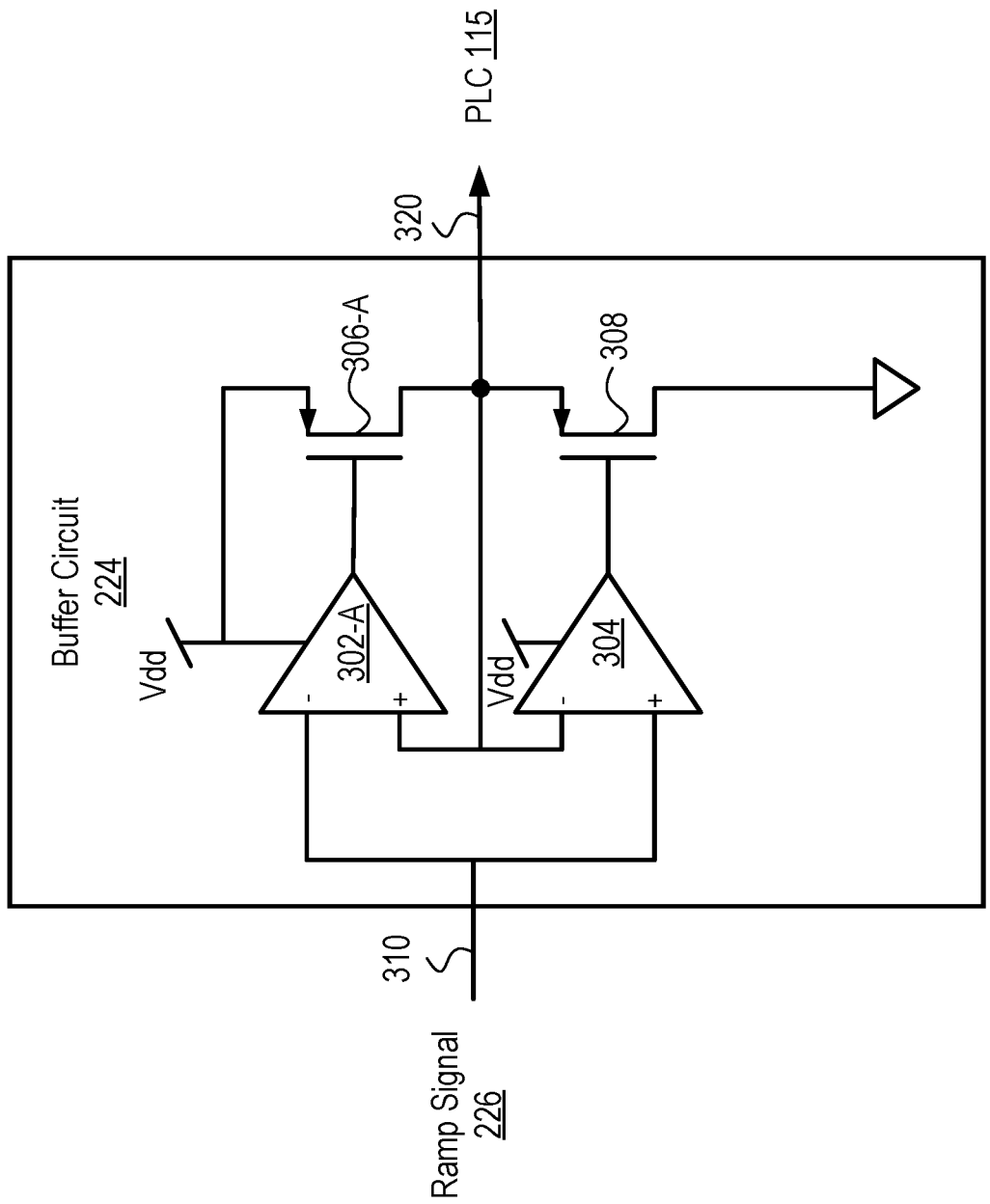
FIG. 3A is a circuit diagram illustrating a first example embodiment of a buffer circuit for a power line communication driver.
Figure 3B:
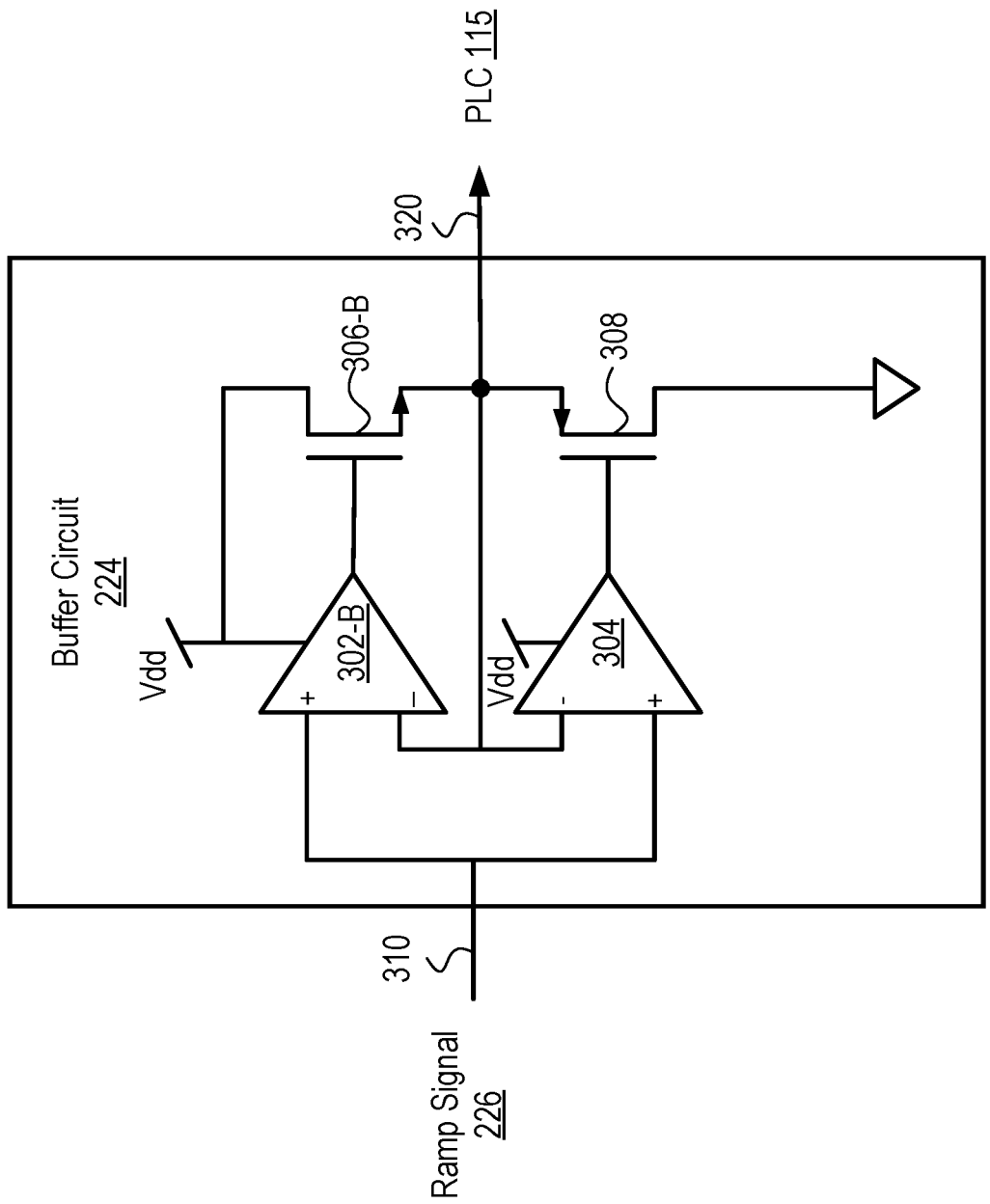
FIG. 3B is a circuit diagram illustrating a second example embodiment of a buffer circuit for a power line communication driver.

FIGS. 3A-B illustrate example embodiments of a buffer circuit 224. The buffer circuit 224 comprises a first operational amplifier 302 (in the configuration of 302-A in FIG. 3A or 302-B in FIG. 3B), a second operational amplifier 304, a first transistor 306 (a p-type transistor 306-A in FIG. 3A or an n-type transistor 306-B in FIG. 3B), and a second transistor 308 (a p-type transistor).

In FIG. 3A, the non-inverting input of the operational amplifier 304 and the inverting input of operational amplifier 302-A are coupled to receive the ramp signal 226 at an input node 310. The non-inverting input of the operational amplifier 302-A and the inverting input of operational amplifier 304 are coupled to an output node 320 (the PLC line 115) in a negative feedback loop. The outputs of the operational amplifiers 302-A, 304 drive the gates of respective transistors 306-A, 308. The transistors 306-A, 308 are coupled in series between Vdd and ground and are coupled to the output node 320 at the midpoint between the transistors 306-A, 308.

In operation, the first and second operational amplifiers 302-A, 304 each provide an appropriate gate voltages to the respective transistors 306-A, 308 to control flow of current through the transistors 306-A, 308 so that the voltage at the output node 320 matches the voltage of the ramp signal 226. The transistors 306-A, 308 operate to source current from Vdd or sink current to ground sufficient that the output voltage at the output node 320 can follow the voltage 310 of the ramp signal 226 and match the configured slew rate of the ramp signal 226 even in the presence of significant load on the PLC line 115. Specifically, if the voltage at the output node 320 begins to drop below the voltage at the input node 310, the operational amplifier 302-A reduces the gate voltage of the transistor 306-A, which causes the transistor 306-A to conduct more current from Vdd (because transistor 306-A is a p-type transistor) and compensate for the drop in voltage of the output node 320. Additionally, the operational amplifier 304 causes the gate voltage of the transistor 308 to increase, which causes the transistor 308 to conduct less current to ground (because transistor 308 is a p-type transistor) which acts to reduce the drop in voltage at the output node 320. Conversely, if the voltage at the output node 320 begins to rise above the voltage at the input node 310, the operational amplifier 302-A increases the gate voltage of the transistor 306-A, which causes the transistor 306-A to conduct less current from Vdd. Additionally, the operational amplifier 304 causes the gate voltage of the transistor 308 to decrease, which causes the transistor 308 to conduct more current to ground and compensate for the rise in voltage at the output node 320. Thus, the buffer 224 controls both sourcing and sinking of current in response to changes in voltage at the output node 320 to follow the input voltage 310 of the ramp signal 226.

The embodiment of FIG. 3B is similar to the embodiment of FIG. 3A except the transistor 306-B is an n-type transistor and inverting and non-inverting inputs (input polarity) of the amplifier 302-B are switched. In this embodiment, when the voltage at the output node 320 drops below the ramp signal 310, the operational amplifier 302-B increases the gate voltage of the transistor 306-B and causes the transistor 306-B to increase the current flow to the output node 320, which acts to compensate for the voltage drop. Conversely, when the voltage at the output node 320 rises above the ramp signal 310, the operational amplifier 302-B decreases the gate voltage of the transistor 306-B and causes the transistor 306-B to decrease the current flow to the output node 320, which acts to compensate for the rise in voltage.

Figure 4:
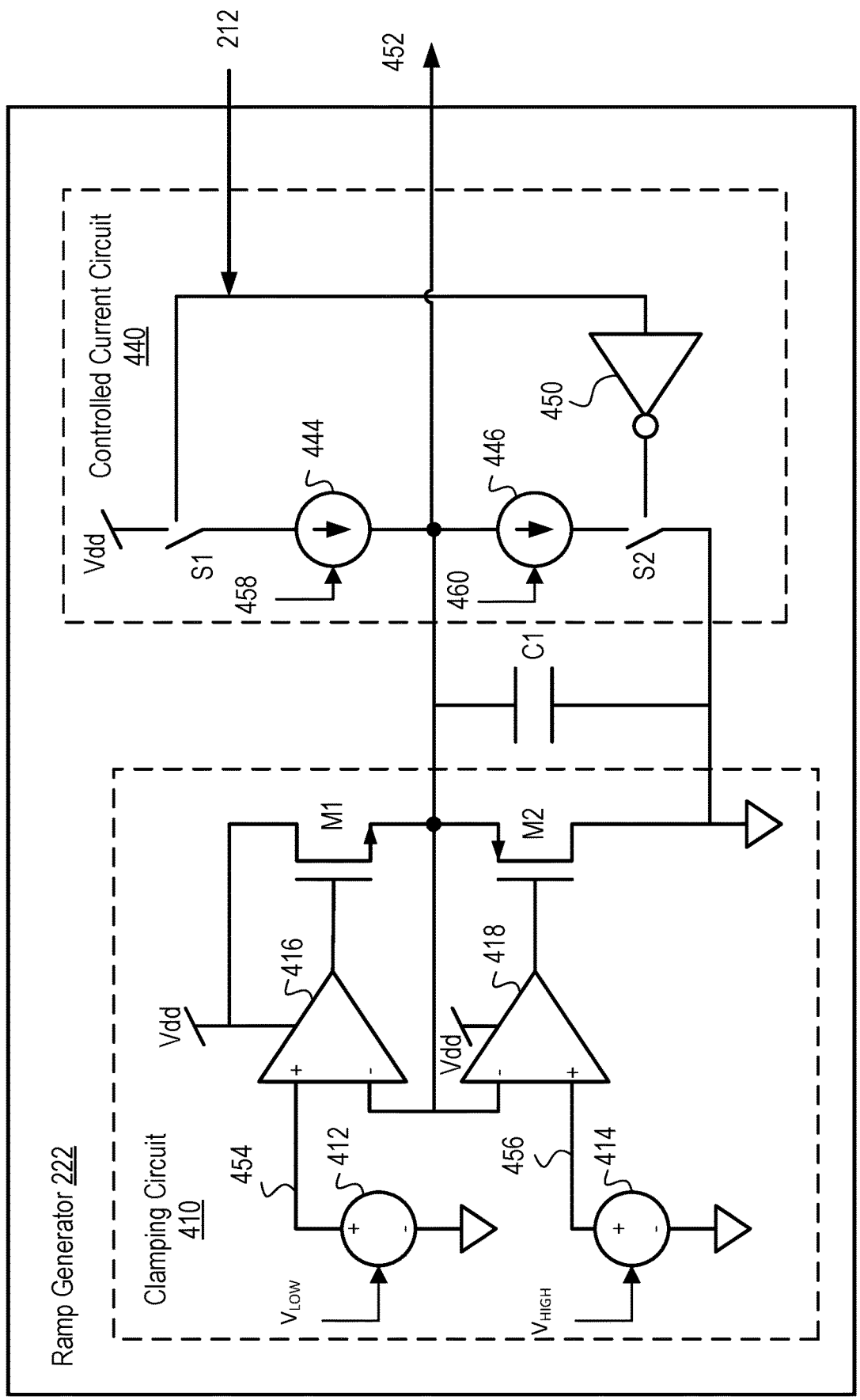
FIG. 4 is a circuit diagram illustrating an example embodiment of a ramp generator for a power line communication driver.

FIG. 4 illustrates an example embodiment of the ramp generator 222. The ramp generator 222 includes a clamping circuit 410, a capacitor C1, and a controlled current circuit 440. The controlled current circuit 440 receives the control signal 212 from the timing controller 210 and controls switching of the switches S1, S2 based on the control signal 212. The inverter 450 inverts the control signal 212 so that the switch S2 closes when the switch S1 opens and vice versa. Specifically, when the control signal 212 has a first logic level, the switch S1 closes and the switch S2 opens; when the control signal 212 has a second logic level, the switch S2 closes and the switch S1 opens. When the switch S1 closes and the switch S2 opens in response to a first logic level of the control signal 212, the current source 444 is coupled to Vdd to activate the current source 444 to source a current configured by the current control signal 458. The current source 444 charges the capacitor C1 and increases the voltage on output node 452 (which is coupled to the input node 310 of the buffer circuit 224). When the switch S1 opens and the switch S2 closes in response to a second logic level of the control signal 212, the current source 446 is coupled to ground to activate the current source 446 to sink a current controlled by the current control signal 460. The current source 446 discharges the capacitor C1 and decreases the voltage on the output node 452.

The current control signals 458, 460 may cause the current sources 444, 446 to operate according to a constant current or a current that varies over time. If the currents are constant, the rate of voltage change across the capacitor C1 is approximately linear and follows the relationship $dV/dt=I/C$, where V is the voltage across the capacitor C1, t is time, I is the constant current and C is the value of the capacitor C1. The polarity of the change in voltage depends on whether the capacitor C1 is charging or discharging and therefore follows the logic level of the control signal 212.

The value of the capacitor charging current, I, controls the slew rate of the capacitor voltage at the output node 452. Here, the rise time of the voltage (ascending slew rate) at the output node 452 is controlled by the current control signal 458 and the fall time of the voltage (descending slew rate) at the output node 452 is controlled by the current control signal 460. Because the buffer circuit 224 follows the ramp generator signal 226 at the output node 452, the slew rate of the PLC signal on the PLC line 115 is also proportional to I. By changing the value of I, the slew rate of the PLC signal on the PLC line 115 changes.

The clamping circuit 410 operates to clamp the voltage of the output node 452 (voltage across the capacitor C1) between a configurable low voltage 454 and a configurable high voltage 456. In operation, the low voltage source 412 outputs the low voltage 454 and the high voltage source 414 outputs the high voltage 456, which are provided to the non-inverting inputs of operational amplifiers 416, 418 respectively. The inverting inputs of the operational amplifiers 416, 418 are coupled to each other and to the output node 452 in a feedback loop. The outputs of the operational amplifiers 416, 418 control the gate voltages of respective transistors M1, M2. The transistors M1, M2 are coupled in series between Vdd and ground and are coupled to each other and to the inverting inputs of the amplifiers 416, 418 at the output node 452. The amplifiers 416, 418 control the current through the transistors M1, M2 so that the output node 452 is maintained between the low voltage 454 and the high voltage 456. Specifically, when the output voltage 452 drops below the low voltage 454, the operational amplifier 416 begins to increase the gate voltage of the transistor M1 (n-type transistor) to cause the transistor M1 to increase the current from Vdd to maintain the output voltage 452 at or above the low voltage 454. In this situation, the output voltage 452 is also below the high voltage 456 and the amplifier 418 controls the transistor M2 (p-type transistor) to turn off, preventing it from sinking the output voltage 452 to ground. If the output voltage 452 exceeds the high voltage 456, the operational amplifier 418 decreases the gate voltage of the transistor M2 (p-type transistor) to cause the transistor M2 to increase the current from the output node 452 to ground to maintain the output voltage 452 at or below the high voltage 456. In this situation, the output voltage 452 is also above the low voltage 454 and the amplifier 416 controls the transistor M1 to turn off, preventing it from sourcing current from Vdd to the output voltage 452. When the output voltage is in between the low voltage 454 and the high voltage 456, the operational amplifiers 416, 418 turn off the respective transistors M1, M2 so that the clamping circuit 410 does not directly affect the output voltage 452.

Figure 5:
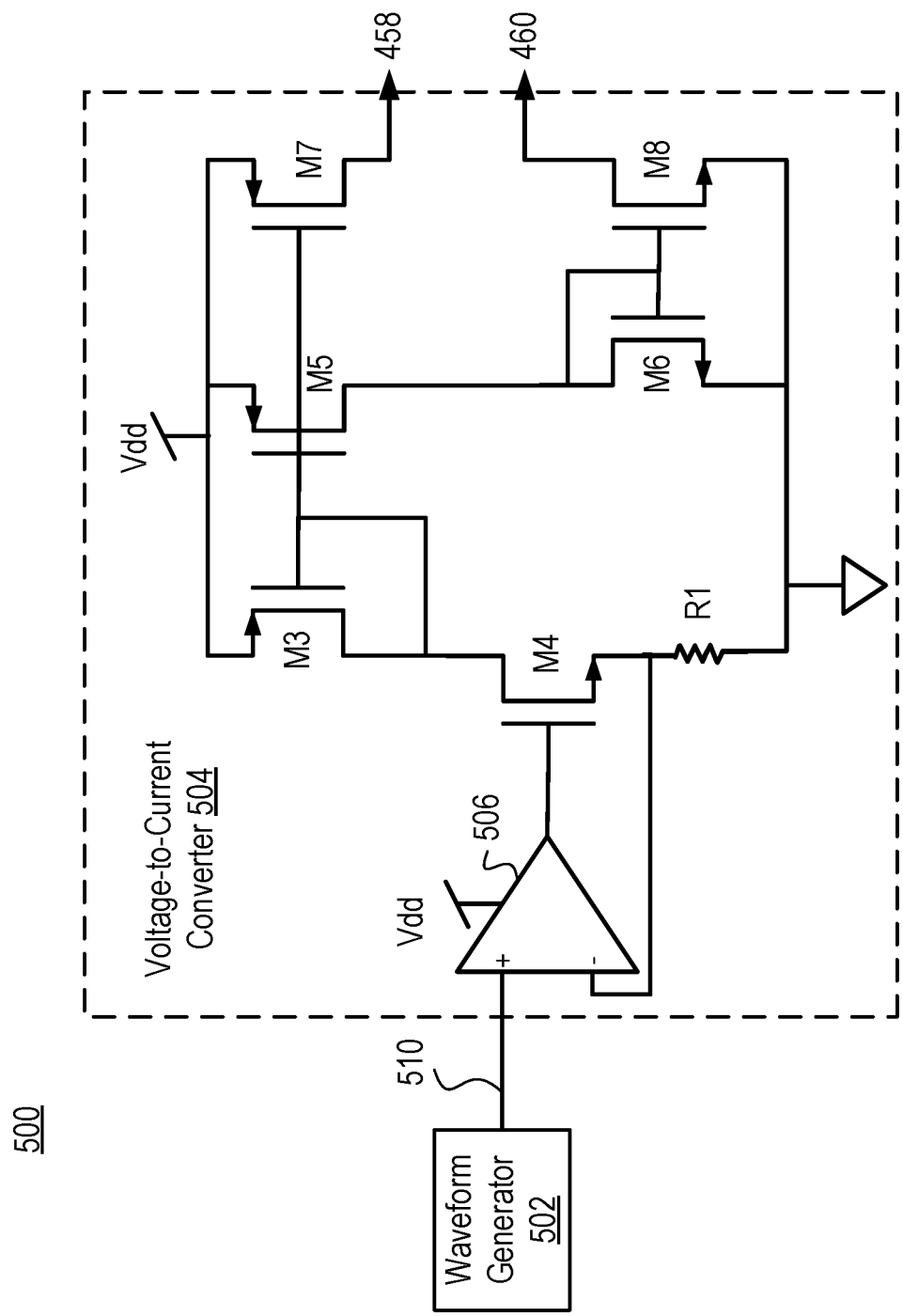
FIG. 5 is a circuit diagram illustrating an example embodiment of a jitter control circuit for a power line communication driver.

FIG. 5 illustrates an example embodiment of a jitter control circuit 500 that can be used to generate the current control signals 458, 460 for controlling the current sources 444, 446 respectively of the ramp generator 222. The jitter control circuit 500 varies the slew rate of the of the ramp generator output 452 and consequently the output on the PLC line 115 over time to add slew rate variation in the ramp generator signal 226. This technique beneficially spreads the spectral energy of the rising and falling edges of the PLC signal on the PLC line 115 over a larger frequency range and reduces EMI spectral energy at particular frequencies.

The jitter control circuit 500 comprises a waveform generator 502 and a voltage-to-current converter 504. The waveform generator 502 generates a control voltage waveform 510. In an embodiment, the control voltage waveform 510 comprises a triangle waveform. Alternatively, the control voltage waveform 510 comprises a different periodic or non-periodic signal (e.g., a random signal). The voltage-to-current converter 504 converts the control voltage waveform 510 to control currents 458, 460. Here, a first control current 458 has similar shape to the control voltage waveform 510 and a second current control signal 460 is inverted relative to the first control current signal 458. The current control signals 458, 460 modulate the current sources 444, 446. In this way, the slew rate of the ramp generator 222 changes over time based on the control voltage waveform 510 (e.g., periodically according to a triangle waveform).

In an embodiment, the voltage-to-current converter 504 comprises an operational amplifier 506 configured as a unity gain follower and a current mirroring circuit including a resistor R1 and transistors M3, M4, M5, M6, M7, M8. The waveform generator 502 outputs the control voltage waveform 510 to the non-inverting input of the operational amplifier 506. The operational amplifier 506 drives a gate of the transistor M4 to control current through a resistor R1 such that the voltage across the resistor R1 follows the control voltage waveform. This current is mirrored through M7 to generate the control current 458. The current is also mirrored through transistor M5, which mirrors and inverts the current through transistors M6, M8 to generate the control current 460. The current sources 444, 446 combine the respective current control signals 458, 460 with respective baseline currents to vary the baselines based on the current control signals 458, 460. For example, in an embodiment, the current control signals 458, 460 cause the current sources 444, 446 to vary the respective slew rates by 20% at a frequency of 30 kHz.

Figure 6:
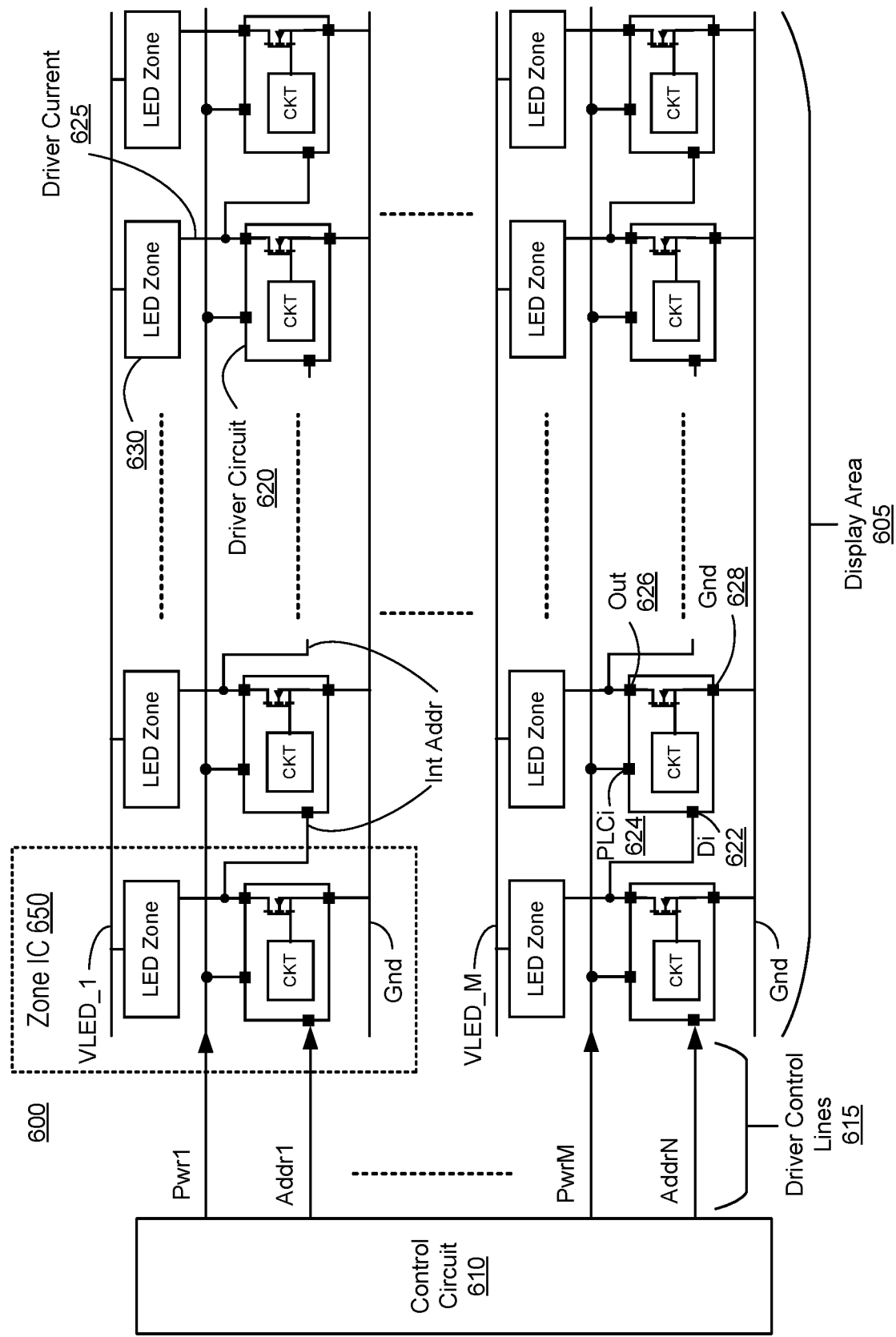
FIG. 6 is a circuit diagram of a display device, according to one embodiment.

FIG. 6 illustrates an example architecture of a display device 600 where the PLC driver 220 can be utilized. In this embodiment, a display area 605 comprises an array of zone ICs 650, which each include an integrated driver circuit 620 and LED zone 630. A control circuit 610 provides driver control lines 615 to groups of zone ICs 650. The control lines 615 include address lines Addr and a PLC lines Pwr. The VLED lines provide power to the LED zones 630 (e.g., by supplying power to the anode of the LEDs in the LED zones 630). The GND lines provide a path to ground for the LED zones 630 and the driver circuits 620.

The driver circuits 620 include a PLC input pin 624, a data input pin 622, an output pin 626, and a ground pin 628. The PLC input pin 624 is configured to receive a PLC signal from the control circuit 610 via the common PLC lines (e.g., Pwr1, Pwr2, . . . PwrM) for each group. The ground pin 628 is configured to provide a path to a ground line for the driver circuit 620, which may be common to the corresponding LED zone 630. The driver circuits 620 drive the LED zones 630 by controlling the respective driver currents 625 to the LED zones 630 in response to driver control signals. In an embodiment, a driver circuit 620 controls a driver current 625 supplied by VLED via an output pin 626 to control the brightness of one LED zone 630 based on the driver control signals. For example, brightness of the LED zone 630 generally increases with increasing driver current 625.

The driver circuits 620 are arranged in groups that share a common set of driver control lines 615, VLED lines, and GND lines. For example, the driver circuits 620 within a group are coupled to a common PLC line Pwr and are each indirectly controlled by a common address communication line Addr (as will be described in further detail below). In an example embodiment, the driver circuits 620 in one group are daisy-chained together via a set of address communication lines that couple adjacent driver circuits 620 (e.g., from the output pin 626 of one driver circuit 620 to a data input pin 622 of the next driver circuit 620).

The driver circuits 620 may operate in various modes including at least an addressing mode, a configuration mode, and an operational mode. During the addressing mode, the control circuit 610 assigns a unique address to each of the driver circuits 620 within a group that is utilized to broadcast further commands and data in the configuration and operational modes. During the configuration mode, the control circuit 610 configures the driver circuits 620 with one or more operating parameters (e.g., overcurrent thresholds, overvoltage thresholds, clock division ratios, and/or slew rate control). During the operational mode, the control circuit 610 provides control data to the driver circuits 620 that causes the driver circuits 620 to control the respective driver currents 625 to the LED zones 630, thereby controlling brightness. In other embodiments, the modes of operation of the display device 600 may include additional, fewer, or different modes of operation. For example, the modes of operation may include an initialization mode and an off mode.

The driver circuit 620 may include a four-pin configuration as shown in the illustrated example of FIG. 6. In the four-pin configuration, the driver circuit 620 may include a data input pin (Di) 622, a power line communication input pin (PLCi) 624, an output pin (Out) 626, and a ground pin (Gnd) 628. In an embodiment, the output 626 may instead comprise a set of pins to control multiple channels of the LED zone 630. For example, the output 626 may include three pins to control red, green, and blue channels of the LED zones 630.

The data input pin 622 is used in the addressing mode to receive an incoming addressing signal via one of the common address communication lines (e.g., Addr1, Addr2, . . . AddrN) from the control circuit 610 (in the case of the first driver circuit 620 in each group) or via one of the address communication lines Int Addr coupling adjacent driver circuits 620 (in the case of remaining driver circuits 620 in each group not directly coupled to the control circuit 610). The incoming addressing signal may be a digital signal that controls an address of each respective driver circuit 620 as will be described in further detail below. The first driver circuit 620 in each group stores an address based on the incoming addressing signal and generates an outgoing addressing signal for outputting via the output pin 626. For example, the driver circuit 620 may receive an address, store the address, and increment the address by 1 or by another fixed amount and send the incremented address as an outgoing addressing signal to the data input pin 622 of the next driver circuit 620 in the group. Alternatively, the driver circuit 620 may receive the address of the prior driver circuit, increment the address, store the incremented address, and send the incremented address to the next driver circuit. In another embodiment, the driver circuit 620 may generate an address based on the incoming address signal according to a different function. Waveforms illustrating the addressing scheme are described in further detail in FIG. 8.

The output pin 626 serves a dual-purpose dependent on the mode of operation. In the addressing mode of the display device 600, the output pin 626 provides the outgoing addressing signal to the next driver circuit 620 in the group of driver circuits 620 as described above. In the operational mode of the display device 600, the output pin 626 is coupled to sink current from a corresponding LED zone 630 to control the driver current 625. In one embodiment, the driver circuit 120 includes more than one output pin 626. For example, in an LED display, the LED zone 630 may comprise three or more LEDs or LED strings corresponding to three sub-pixels (e.g., a red sub-pixel, a green sub-pixel, and a blue sub-pixel), and the driver circuit 620 may include three output pins 626, one for each color channel.

The PLC input pin 624 is configured to receive a PLC signal from the control circuit 610 via the common PLC lines (e.g., Pwr1, Pwr2, . . . PwrM) for each group. During the configuration mode, the PLC signal provides as digital data, one or more operating parameters (e.g., various overcurrent thresholds or overvoltage thresholds to protect the LEDs from overstress, different clock division ratios, and slew rate control of the driver current 625). During the operational mode, the PLC signal provides control data (e.g., brightness control information) for the LED zones 630. The brightness control information may include one or more address words to identify a driver circuit 620 within a group of the driver circuits 620 and one or more data words for controlling brightness of the LED zone 630 by controlling the driver current 625 of the identified driver circuit 620.

The ground pin 628 is configured to provide a path to a ground line for the driver circuit 620, which may be common to the corresponding LED zone 630.

The control circuit 610 generates the address communication signals Addr and the PLC signals Pwr to control the display area 605 via the common driver control lines 615. The control circuit 610 may include PLC drivers 222 as described above for driving the PLC signals. In one example implementation, a number (M) of common PLC lines Pwr and a number (N) of common address communication lines Addr are equal (e.g., M=N).

Figure 7:
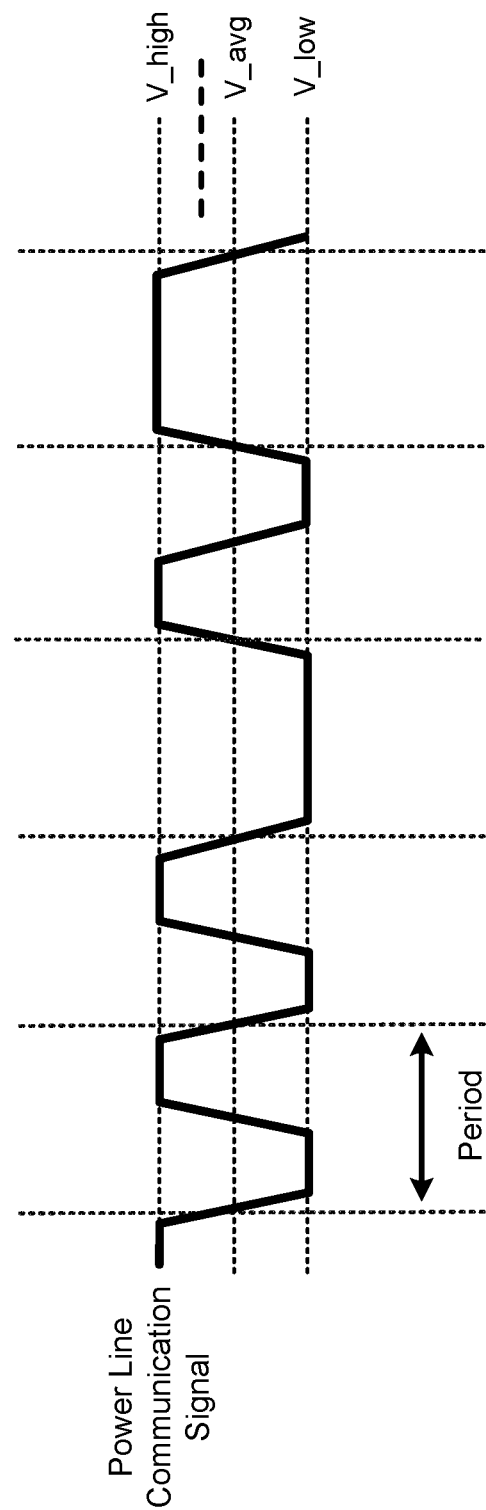
FIG. 7 is a waveform diagram illustrating an example waveform of a power line communication signal, according to one embodiment.

FIG. 7 is a waveform diagram illustrating an example waveform of a PLC signal, according to one embodiment. The PLC signal switches between high data voltages V_high and low data voltages V_low to encode the digital data (e.g., operating parameters or brightness control information) that results in an average voltage of approximately V_avg. In one example embodiment, the high data voltage V_high is 5.5 volts, the low data voltage V_low is 4.5 volts, and the average voltage V_avg is 5 volts. The digital data may be encoded using biphase mark code encoding as described above.

Figure 8:
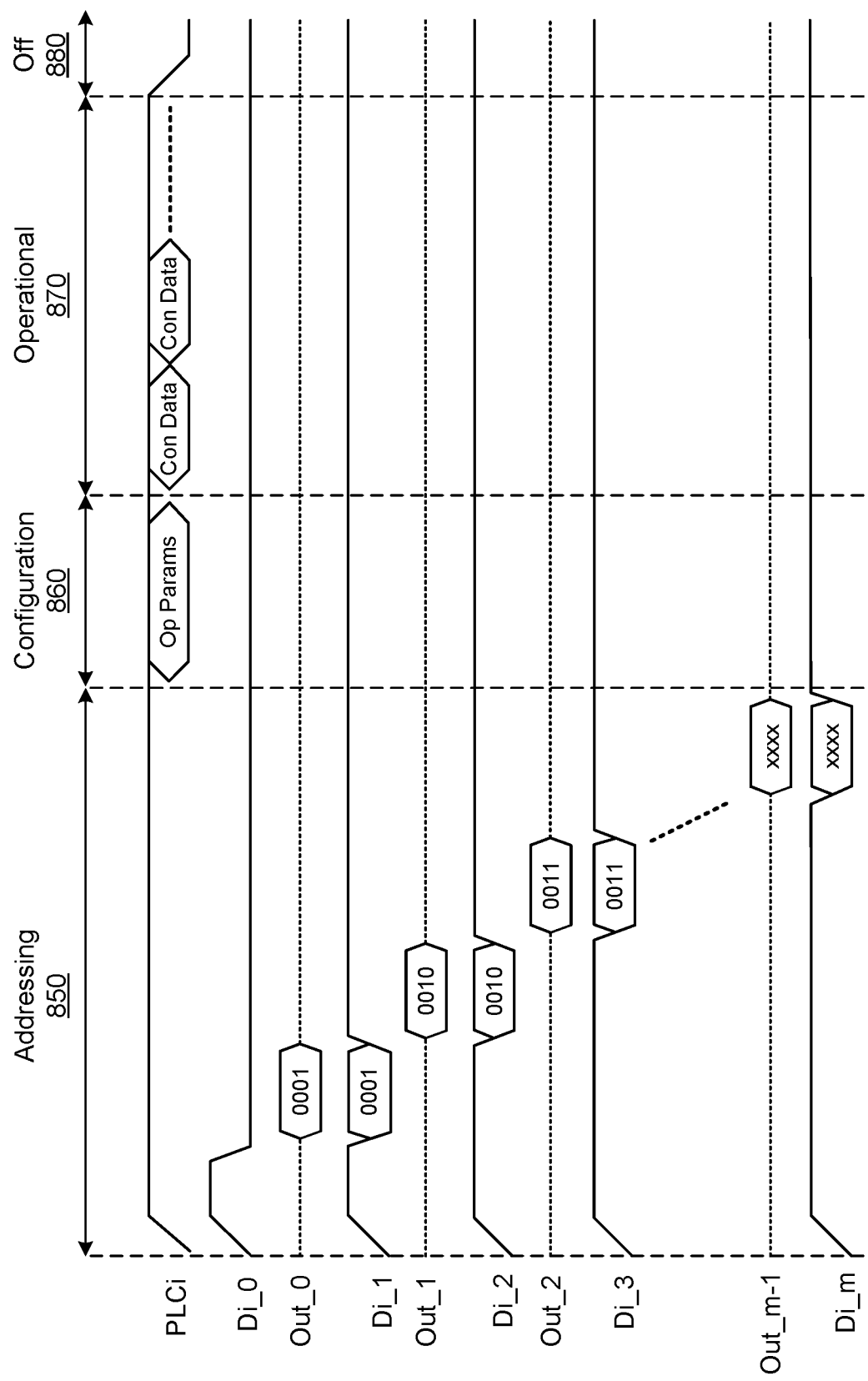
FIG. 8 is a waveform diagram illustrating the operational modes of the display device, according to one embodiment.

FIG. 8 is a waveform diagram illustrating the operational modes of the display device 600, according to one embodiment. The three modes of operation (i.e., the addressing mode 850, the configuration mode 860, and the operational mode 870) of the display device 800 are depicted along with an off mode 880. FIG. 8 illustrates the PLC signal received at a power line communication input pin (PLCi) 624, the address communication signals received at the data input pins 622 (e.g., Di_0, Di_1, . . . Di_m), and the address communication signals provided by the output pins 626 (e.g., Out_0, Out_1, . . . Out_m−1) of the driver circuits 620 in a group of driver circuits 620 during the various modes of operation.

During the addressing mode 850 of operation, the PLC signal received at the PLC input pin 624 transitions from low to high (i.e., the driver circuits 620 begin to receive a supply voltage) at the beginning of the addressing mode 850. The address communication signals propagate through the data input pins 622 and output pins 626 of the driver circuits 620 to assign the respective addresses to the driver circuits 620. For instance, the control circuit 610 outputs a logic high signal on the common address communication line Addrn for the group n and the first driver circuit 620 in group n of driver circuits 620 receives the high signal at its data input pin 622 (i.e., Di_0) as an incoming addressing signal. Responsive to detecting the high signal on Di_0, the driver circuit sets its address to an initial address value (e.g., 0000). The first driver circuit 620 stores the address, increments the address value (i.e., increases the address value by one), and provides the incremented address (e.g., 0001) as an outgoing addressing signal via the output pin 626 (i.e., Out_0) and the address communication line Int Addr. The next (successive) driver circuit 620 in group n receives the incremented address (i.e., 0001) at its data input pin 622 (i.e., Di_1) as an incoming addressing signal. The driver circuit 620 similarly stores the address 0001, increments the address, and provides the incremented address (e.g., 0010) as an outgoing addressing signal via the output pin 626 (i.e., Out_1) and the address communication line Int Addr to the next driver circuit 620 in group n. The progression of receiving and storing an address, incrementing the address, and sending the incremented address onto the next driver circuit 620 continues until the addressing mode completes (i.e., all driver circuits 620 in a group of driver circuits 620 have been assigned an address). In some embodiments, the driver circuit 620 may instead modify the incoming address before storing it. For example, the driver circuit receives an address, increments the address, and stores and outputs the incremented address. In other alternative embodiments, a different arbitrary addressing scheme may be used in which each driver circuit 620 may generate the next address according to some other function that is not necessarily incrementing. For example, the driver circuits 620 may decrement the address, generate random addresses, or apply some other arbitrary function to generate new addresses.

During the configuration mode 860, the power line communication signal received at the power line communication input pin 624 provides various operating parameters (Op Params) as digital data on the PLC input pin 624.

During the operational mode 870, the power line communication signal provides control data (Con Data) as digital data modulated onto the supply voltage. The Con Data may be updated with each image frame or video frame. The operational mode 870 continues until the power line communication signal transitions from high to low (i.e., the driver circuits 620 no longer receive a supply voltage) at which point the driver circuits 620 turn off.

Figure 9:
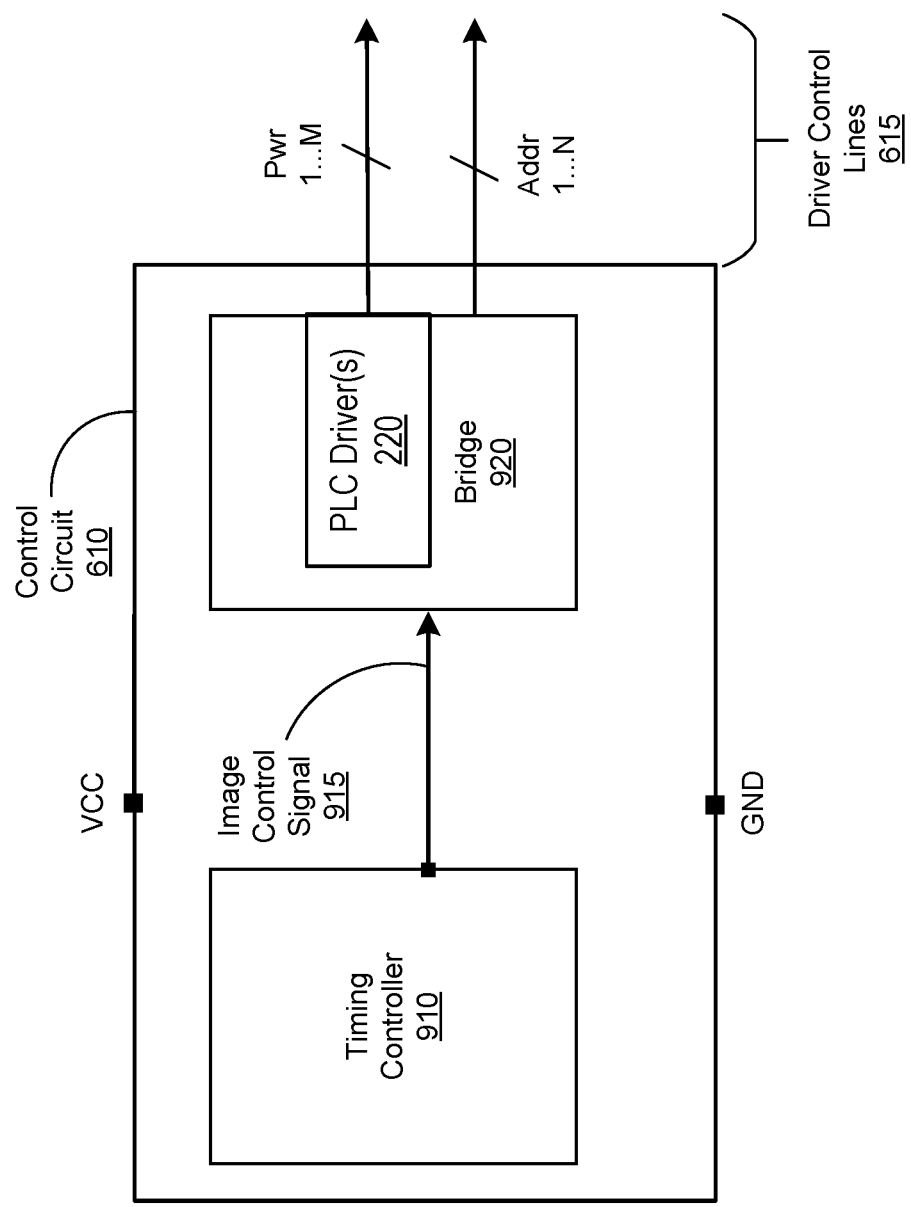
FIG. 9 is an example circuit diagram of a control circuit for a display device, according to one embodiment.

FIG. 9 is an example circuit diagram of a control circuit 610, according to one embodiment. The control circuit 610 generates the address communication signal Addr and the PLC signal Pwr to control the display device (e.g., the display device 600) and provides the signals via the driver control lines 615 to the driver circuits 620. The control circuit 610 may include a timing controller 910 and a bridge 920. In various embodiments, the control circuit 610 may include additional, fewer, or different components. For example, in some embodiments, the control circuit 610 may be implemented using a field programmable gate array (FPGA) and/or a PHY block. The control circuit 610 is powered by an input voltage (VCC) and is connected to ground (GND). The control circuit 610 may control the display device using either active matrix (AM) or passive matrix (PM) driving methods.

The timing controller 910 generates an image control signal 915 indicating values for driving pixels of the display device 600 and timing for driving the pixels. For example, the timing controller 910 controls timing of image frames or video frames and controls timing of driving each of the LED zones 630 within an image frame or video frame. Furthermore, the timing controller 910 controls the brightness for driving each of the LED zones 630 during a given image frame or video frame. The image control signal 915 is provided by the timing controller 910 to the bridge 920.

The bridge 920 translates the image control signal 915 to the address communication signal Addr and to the driver control signals of the PLC signal Pwr. For example, the bridge 920 may generate an address communication signal Addr for the first driver circuit 620 in the group of driver circuits 620 during the addressing mode according to the control scheme described above. The bridge 920 includes a PLC driver 220 as described above for driving the PLC signals on the PLC lines.

Figure 10:
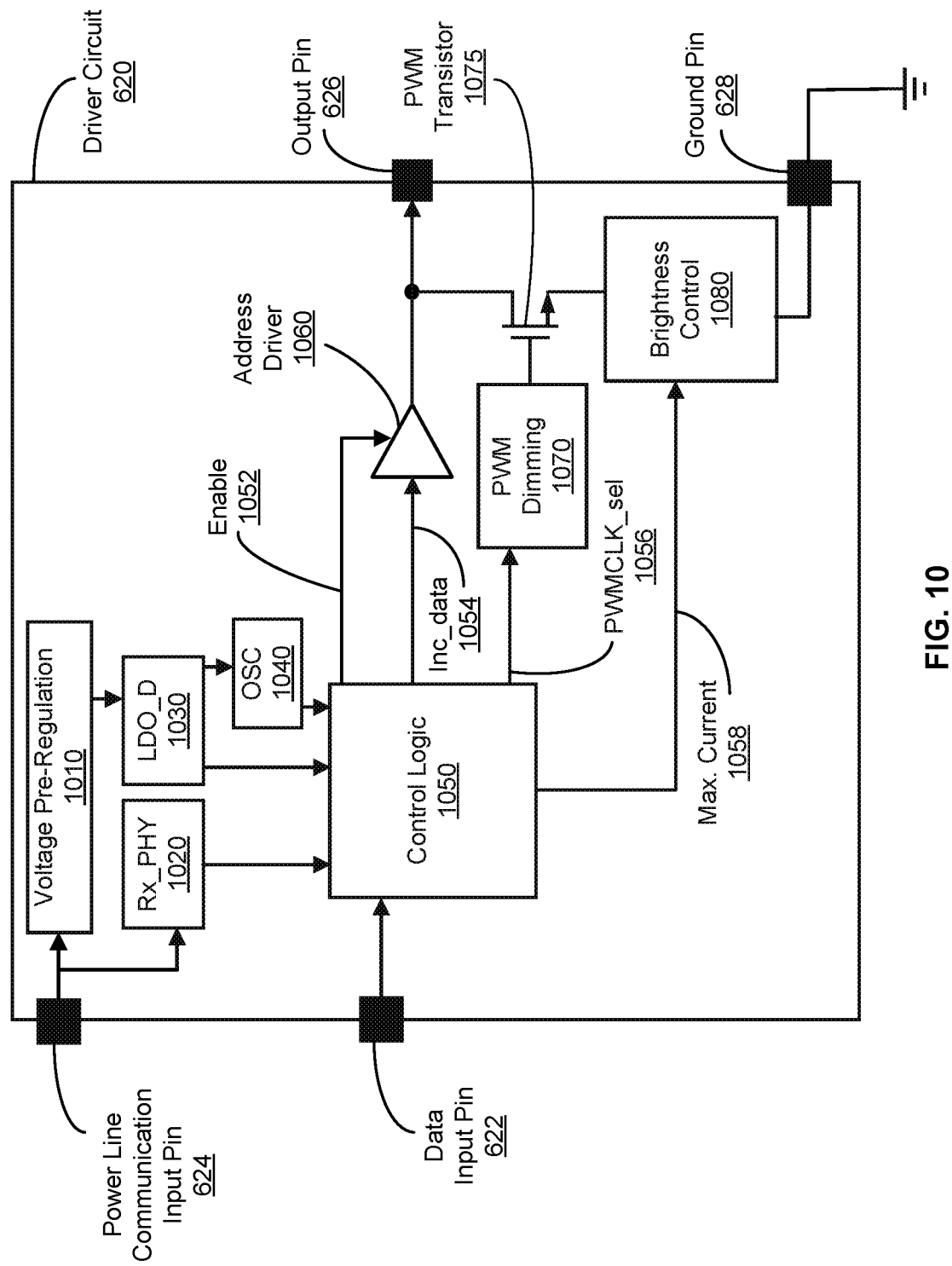
FIG. 10 is an example circuit diagram of a driver circuit for a display device, according to one embodiment.

FIG. 10 is an example circuit diagram of the driver circuit 620, according to one embodiment. The driver circuit 620 may include a voltage pre-regulation circuit 1010, an Rx_PHY 1020, a low-dropout regulator LDO_D 1030, an oscillator OSC 1040, control logic 1050, an address driver 1060, a pulse width modulation (PWM) dimming circuit 1070, a transistor 1075, and a brightness control circuit 1080. In various embodiments, the driver circuit 620 may include additional, fewer, or different components.

The supply voltage represents a direct current component of the PLC signal while the digital data represents the modulated component of the PLC signal. In an example embodiment, the voltage pre-regulation circuit 1010 comprises a first order RC filter followed by a source follower. The voltage pre-regulator 1010 may optionally be omitted and the PLC signal may instead pass directly to the LDO-D 1030. The digital data (e.g., the driver control signal) is provided to the Rx_PHY 1020 from the PLC input pin 624. The Rx_PHY 1020 is a physical layer that demodulates the PLC data from the PLC pin 624 and provides the corresponding digital data to the control logic block 1050. In an example embodiment, the Rx_PHY 1020 provides a connection with a maximum bandwidth of 2 MHz with a cascade of 36 driver circuit stages. The pre-regulated supply voltage is provided to the LDO_D 1030. The LDO_D 1030 converts the pre-regulated supply voltage into a direct current voltage (which may be lower than the supply voltage) used to power the oscillator OSC 1040, the control logic 1050, and other components (not shown). In an example embodiment, the direct current voltage may be 1.8 volts. The oscillator OSC 1040 provides a clock signal. In an example embodiment, the maximum frequency of the clock signal is approximately 10.7 MHz.

The control logic 1050 receives the driver control signal from the Rx_PHY 1020, the direct current voltage from the LDO_D 1030, and the clock signal from the oscillator OSC 1040. Dependent on the mode of operation of the display device, the control logic 1050 may also receive digital data from the incoming addressing signal received at the data input pin 622. Dependent on the mode of operation, the control logic 1050 may output an enable signal 1052, an incremented data signal Inc_data 1054, a PWM clock selection signal PWMCLK_sel 1056, and a maximum current signal Max. Current 1058. During the addressing mode, the control logic 1050 activates the enable signal 1052 to enable the address driver 1060. The control logic 1050 receives an incoming address signal via the data input pin 622, stores the address, and provides the incremented data signal Inc_data 1054 representing an outgoing address to the address driver 1060. The address driver 1060 buffers the incremented data signal Inc_data 1054 to the output pin 626 when the enable signal 1052 is activated during the addressing mode. The control logic 1050 may control the PWM dimming circuit 1070 to turn off the transistor 1075 during the addressing mode to effectively block the current path from the LEDs.

During the operational mode and configuration modes, the control logic deactivates the enable signal 1052 and the output of the address driver 1060 is tri-stated to effectively decouple it from the output pin 626. During the operational mode, the PWM clock selection signal PWMCLK_sel 1056 specifies a duty cycle for controlling PWM dimming by the PWM dimming circuit 1070. Based on the selected duty cycle, the PWM dimming circuit 1070 controls timing of an on-state and an off-state of the transistor 1075. During the on-state of the transistor 1075, a current path is established from the output pin 626 (coupled to the LED zones 630) to the ground pin 628 through the transistor 1075 and the brightness control circuit 1080 sinks the driver current through the LEDs of the LEDs zones 630. During an off-state of the transistor 1075, the current path is interrupted to block current from flowing through the LED zones 630. The brightness control circuit 1080 receives the maximum current signal Max. Current 358 from the control logic 1050 and controls the current level that flows through the LEDs (from the output pin 626 to the ground pin 628) when the transistor 1075 is in the on-state. During the operational mode, the control logic 1050 controls the duty cycle of the PWM dimming circuit 1070 and the maximum current Max. Current 1058 of the brightness control circuit 1080 to set the LED zones 630 to the desired brightness.

Figure 11A:
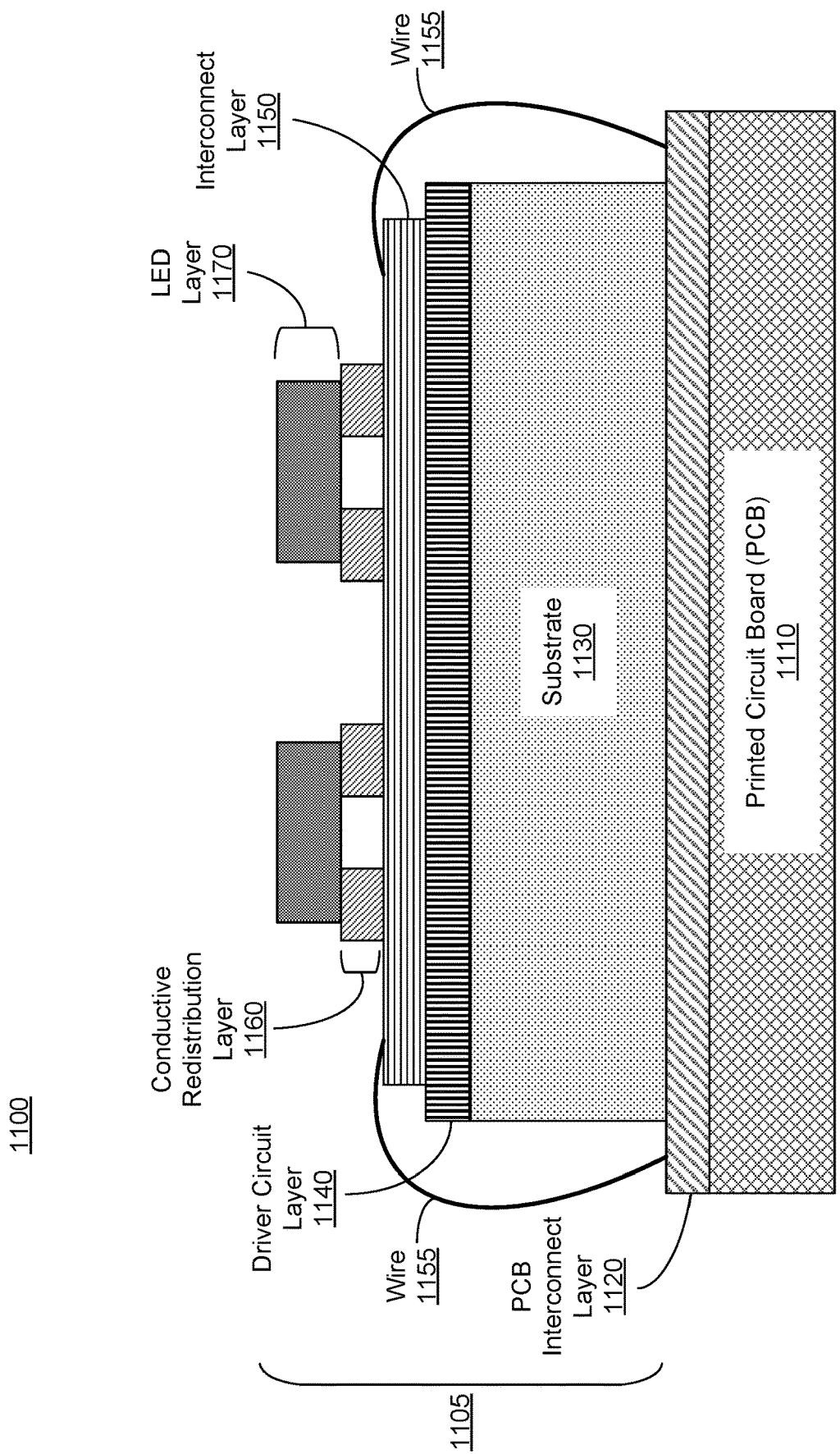
FIG. 11A is a cross sectional view of a first embodiment of an LED and driver circuit that may be utilized in a display device.

FIG. 11A is a cross sectional view of a first embodiment of a display device 1100 including an integrated LED and driver circuit 1105.

In the example shown in FIG. 11A, the display device 1100 includes a printed circuit board (PCB) 1110, a PCB interconnect layer 1120, and the integrated LED and driver circuit 1105 which comprises a substrate 1130, a driver circuit layer 1140, an interconnect layer 1150, a conductive redistribution layer 1160, and an LED layer 1170. Bonded wires 1155 may be included for connections between the PCB interconnect layer 1120 and the integrated LED and driver circuit 1105. The PCB 1110 comprises a support board for mounting the integrated LED and driver circuit 1105, the control circuit 610 and various other supporting electronics. The PCB 1110 may include internal electrical traces and/or vias that provide electrical connections between the electronics. A PCB interconnect layer 1120 may be formed on a surface of the PCB 1110. The PCB interconnect layer 1120 includes pads for mounting the various electronics and traces for connecting between them.

The integrated LED and driver circuit 1105 includes the substrate 1130 that is mountable on a surface of the PCB interconnect layer 1120. The substrate 1130 may be, e.g., a silicon (Si) substrate. In other embodiments, the substrate 1130 may include various materials, such as gallium arsenide (GaAs), indium phosphide (InP), gallium nitride (GaN), aluminum nitride (AlN), sapphire, silicon carbide (SiC), or the like.

The driver circuit layer 1140 may be fabricated on a surface of the substrate 1130 using silicon transistor processes (e.g., BCD processing). The driver circuit layer 1140 may include one or more driver circuits 620 (e.g., a single driver circuit 620 or a group of driver circuits 620 arranged in an array). The interconnect layer 1150 may be formed on a surface of the driver circuit layer 1140. The interconnect layer 1150 may include one or more metal or metal alloy materials, such as Al, Ag, Au, Pt, Ti, Cu, or any combination thereof. The interconnect layer 1150 may include electrical traces to electrically connect the driver circuits 620 in the driver circuit layer 1140 to wire bonds 1155, which are in turn connected to the control circuit 610 on the PCB 1110. In an embodiment, each wire bond 1155 provides an electrical connection. For example, the integrated LED and driver circuit 1105 may include five wire bonds including a first wire for providing the driver control signal from the control circuit 610 on the PCB 1110 to one or more driver circuits 620 on the driver circuit layer 1140, a second wire to provide an incoming address signal to the driver circuit layer 1140, a third wire to provide an outgoing address signal from the driver circuit layer 1140, a fourth wire to provide the supply voltage (e.g., VLED) to the LEDs in a LED zone 630 on the LED layer 1170, and a fifth wire to provide a path to a circuit ground (GND). Additionally, the interconnect layer 1150 may provide electrical connections for supplying the driver current between the driver circuit layer 1140 and the conductive redistribution layer 1160.

In an embodiment, the interconnect layer 1150 is not necessarily distinct from the driver circuit layer 1140 and these layers 1140, 1150 may be formed in a single process in which the interconnect layer 1150 represents a top surface of the driver layer 1140.

The conductive redistribution layer 1160 may be formed on a surface of the interconnect layer 1150. The conductive redistribution layer 1160 may include a metallic grid made of a conductive material, such as Cu, Ag, Au, Al, or the like. The LED layer 1170 includes LEDs that are on a surface of the conductive redistribution layer 1160. The LED layer 1170 may include arrays of LEDs arranged into the LED zones 630 as described above. The conductive redistribution layer 1160 provides an electrical connection between the LEDs in the LED layer 1170 and the one or more driver circuits in the driver circuit layer 1140 for supplying the driver current and provides a mechanical connection securing the LEDs over the substrate 1130 such that the LED layer 1170 and the conductive redistribution layer 1160 are vertically stacked over the driver circuit layer 1140.

Thus, in the illustrated circuit 1105, the one or more driver circuits 620 and the LED zones 130 including the LEDs are integrated in a single package including a substrate 1130 with the LEDs in an LED layer 1170 stacked over the driver circuits 620 in the driver circuit layer 1140. By stacking the LED layer 1170 over the driver circuit layer 1140 in this manner, the driver circuits 620 can be distributed in the display area 605 of a display device 600.

Figure 11B:
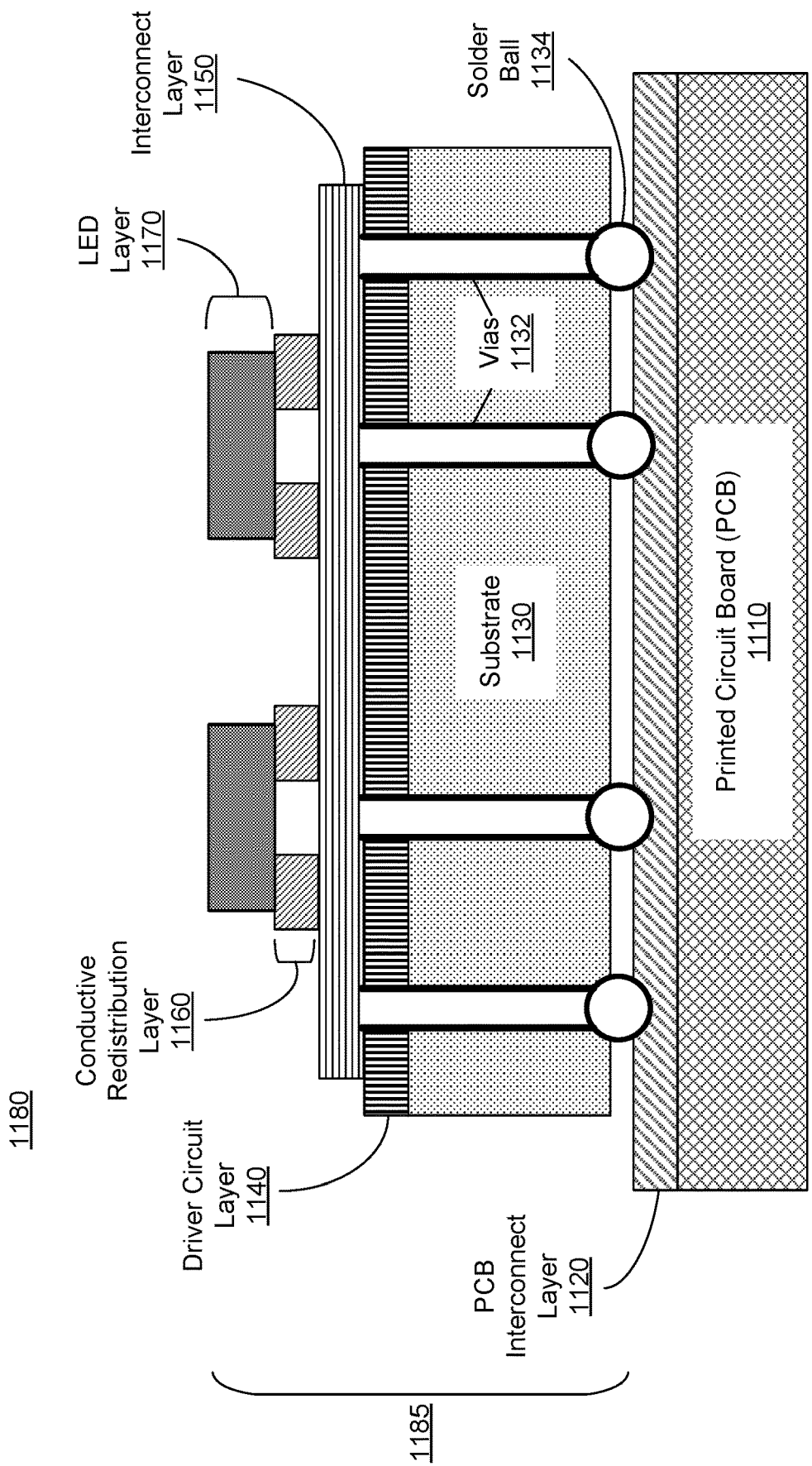
FIG. 11B is a cross sectional view of a second embodiment of an LED and driver circuit that may be utilized in a display device.

FIG. 11B is a cross sectional view of a second embodiment of a display device 1180 including an integrated LED and driver circuit 1185, according to one embodiment. The device 1180 is substantially similar to the device 1100 described in FIG. 11A but utilizes vias 1132 and corresponding connected solder balls 1134 to make electrical connections between the driver circuit layer 1140 and the PCB 1110 instead of the wires 1155. Here, the vias 1132 are plated vertical electrical connections that pass completely through the substrate layer 1130. In one embodiment, the substrate layer 1130 is a Si substrate and the through-chip vias 1132 are Through Silicon Vias (TSVs). The through-chip vias 1132 are etched into and through the substrate layer 1130 during fabrication and may be filled with a metal, such as tungsten (W), copper (C), or other conductive material. The solder balls 1134 comprise a conductive material that provide an electrical and mechanical connection to the plating of the vias 1132 and electrical traces on the PCB interconnect layer 1120. In one embodiment, each via 1132 provides an electrical connection for providing signals such as the driver control signal from the control circuit 610 on the PCB 1110 to a group of driver circuits 620 on the driver circuit layer 1140. The vias 1132 may also provide connections for the incoming and outgoing addressing signals, the supply voltage (e.g., VLED) to the LEDs in a LED zone 630 on the LED layer 1170, and the path to a circuit ground (GND). For example, five or more vias 1132 may be utilized to provide these connections.

Figure 11C:
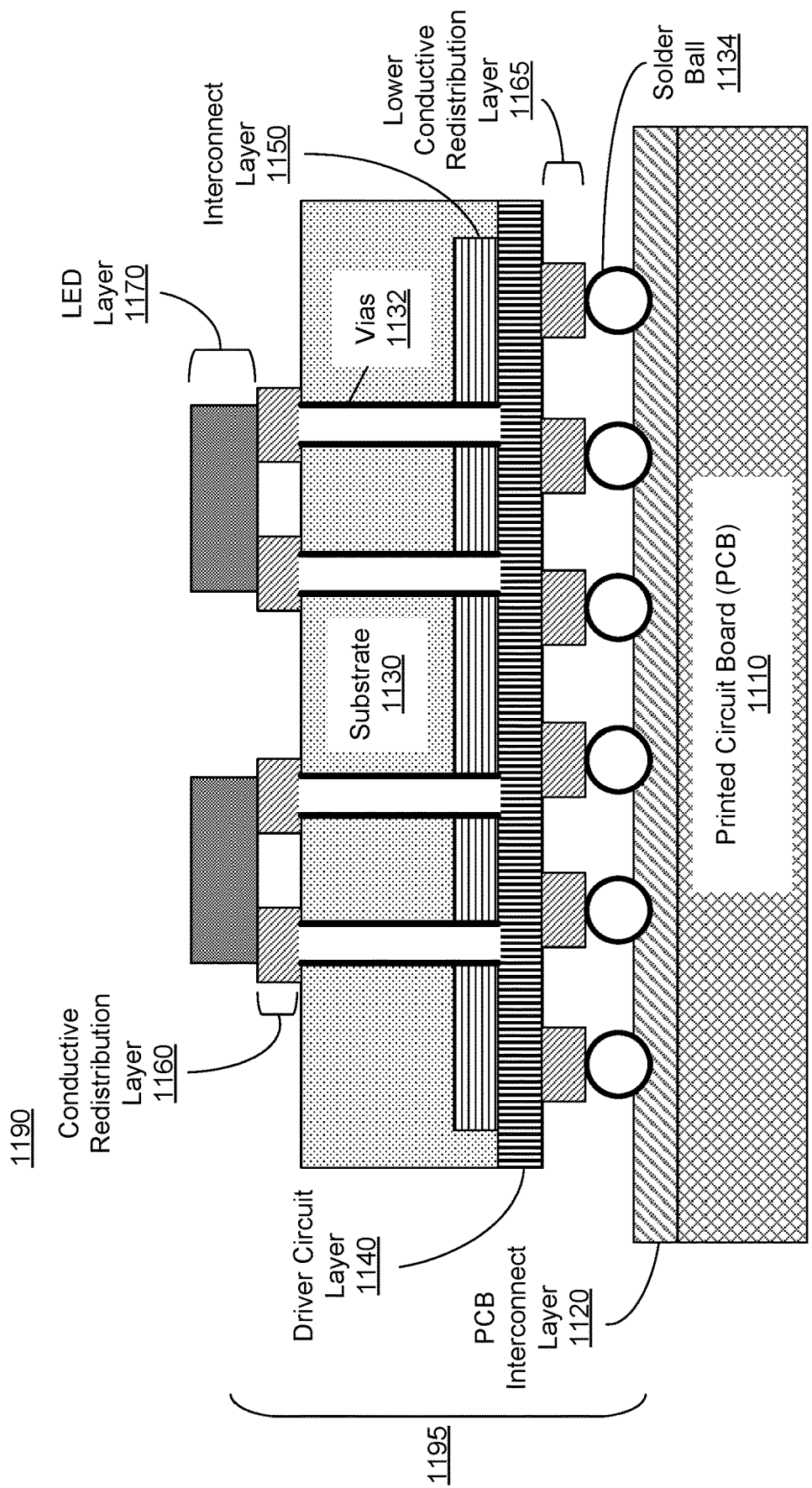
FIG. 11C is a cross sectional view of a third embodiment of an LED and driver circuit that may be utilized in a display device.

FIG. 11C is a cross sectional view of a third embodiment of a display device 1190 including an integrated LED and driver circuit 1195. The device 1190 is substantially similar to the device 1180 described in FIG. 11B but includes the driver circuit layer 1140 and interconnect layer 1150 on the opposite side of the substrate 1130 from the conductive redistribution layer 1160 and the LED layer 1170. In this embodiment, the interconnect layer 1150 and the driver circuit layer 1140 are electrically connected to the PCB 1110 via a lower conductive redistribution layer 1165 and solder balls 1134. The lower conductive redistribution layer 1165 and solder balls 1134 provide mechanical and electrical connections (e.g., for the driver control signals) between the driver circuit layer 1140 and the PCB interconnect layer 1120. The driver circuit layer 1140 and interconnect layer 1150 are electrically connected to the conductive redistribution layer 1160 and the LEDs of the LED layer 1170 via one or more plated vias 1132 through the substrate 1130. The one or more vias 1132 seen in FIG. 11C may be utilized to provide the driver currents from the driver circuits in the driver circuit layer 1140 to the LEDs in the LED layer 1170 and other signals as described above In alternative embodiments, the integrated driver and LED circuits 1105, 1185, 1195 may be mounted to a different base such as a glass base instead of the PCB 1110.

Figure 12:
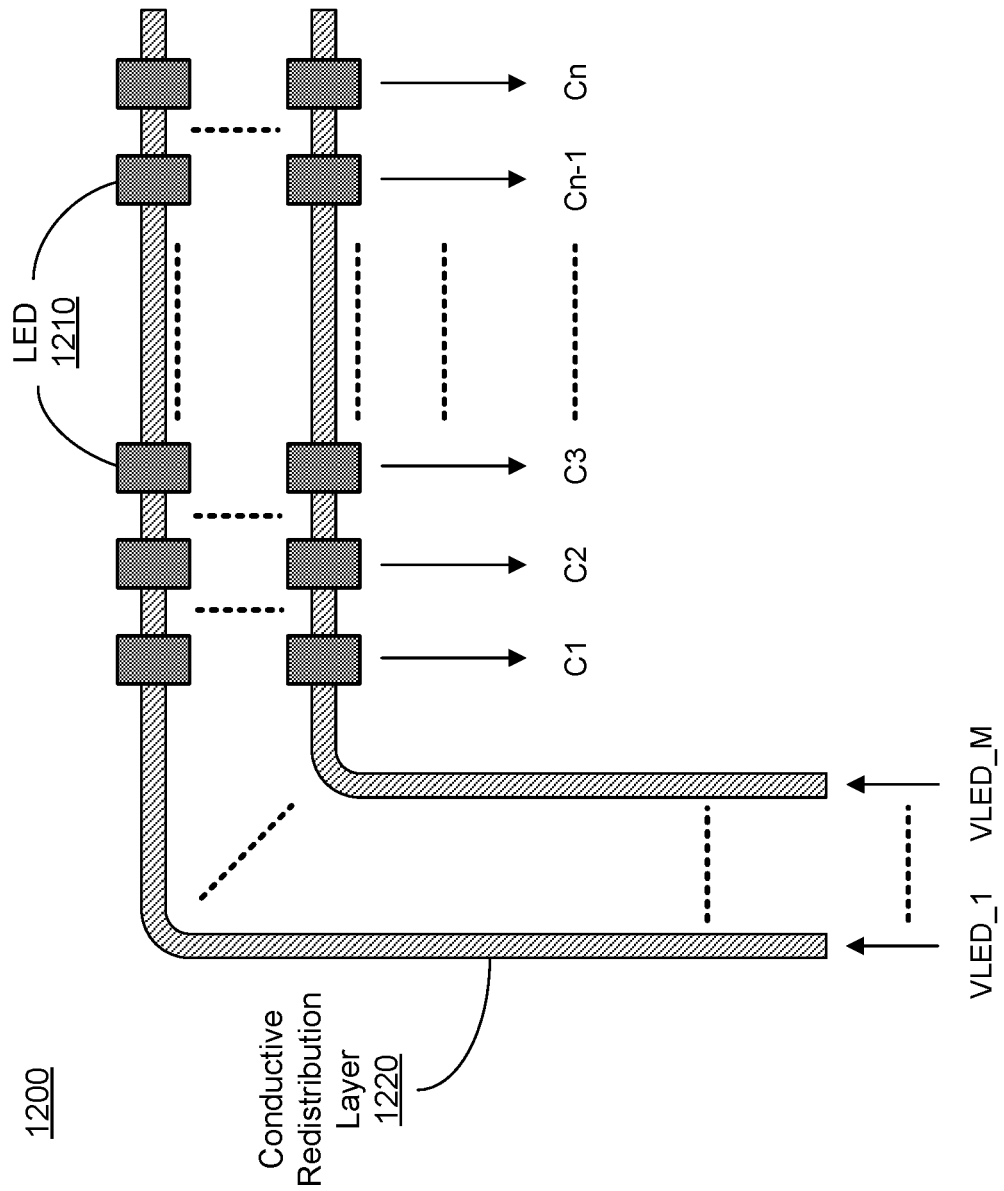
FIG. 12 is a top down view of a display device using an LED and driver circuit, according to one embodiment.

FIG. 12 is a top down view of a display device using an integrated LED and driver circuit 1200, according to one embodiment. The circuit 1200 can correspond to a top view of any of the integrated LED and driver circuits 1105, 1185, 1195 depicted in FIGS. 11A-11C. A plurality of LEDs 1210 is arranged in rows and columns (e.g., C1, C2, C3, ... Cn-1, Cn) in FIG. 12. For passive matrix architectures, each row of LEDs 1210 is connected by a conductive redistribution layer 1220 to a demultiplexer which outputs a plurality of VLED signals (i.e., VLED_1 ... VLED_M). The VLED signals provide power (i.e., a supply voltage) to a corresponding row of LEDs 1210 via the conductive redistribution layer 1220.

Figure 13:
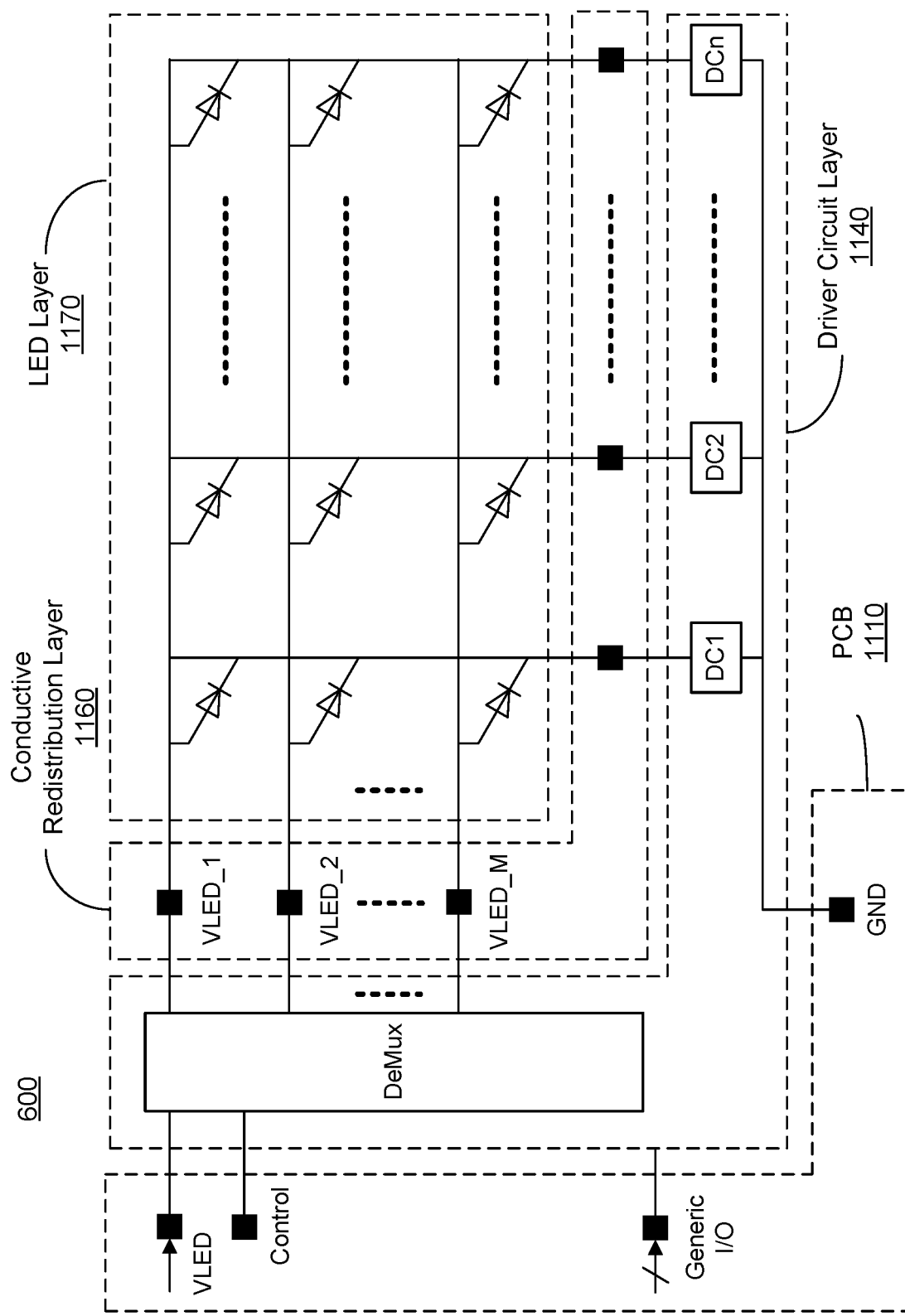
FIG. 13 illustrates a schematic view of several layers of an LED and driver circuit for a display device, according to one embodiment.

FIG. 13 illustrates a schematic view of several layers of a display device 600 with an integrated LED and driver circuit, according to one embodiment. The schematic view includes the PCB 1110, the driver circuit layer 1140, the conductive redistribution layer 1160, and the LED layer 1170 as described in FIGS. 11A-11C. The schematic of FIG. 13 shows circuit connections for the circuits 1105, 1185, 1195 of FIGS. 11A-C but does not reflect the physical layout. As described above, in the physical layout, the LED layer 1170 is positioned on top of (i.e., vertically stacked over) the conductive redistribution layer 1160. The conductive redistribution layer 1160 is positioned on top of the driver circuit layer 1140 and the driver circuit layer 1140 is positioned on top of the PCB 1110.

The PCB 1110 includes a connection to a power source supplying power (e.g., VLED) to the LEDs, a control circuit for generating a control signal, generic I/O connections, and a ground (GND) connection. The driver circuit layer 1140 includes a plurality of driver circuits (e.g., DC1, DC2, ... DCn) and a demultiplexer DeMux. The conductive redistribution layer 1160 provides electrical connections between the driver circuits and the demultiplexer DeMux in the driver circuit layer 1140 to the plurality of LEDs in the LED layer 1170. The LED layer 1170 includes a plurality of LEDs arranged in rows and columns. In this example implementation, each column of LEDs is electrically connected via the conductive redistribution layer 1160 to one driver circuit in the driver circuit layer 1140. The electrical connection established between each driver circuit and its respective column of LEDs controls the supply of driver current from the driver circuit to the column. In this embodiment, each diode shown in the LED layer corresponds to an LED zone. Each row of LEDs is electrically connected via the conductive redistribution layer 1160 to one output (e.g., VLED_1, VLED 2, ... VLED_M) of the demultiplexer DeMux in the driver circuit layer 1140. The demultiplexer DeMux in the driver circuit layer 1140 is connected to a power supply (VLED) and a control signal from the PCB 1110. The control signal instructs the demultiplexer DeMux which row or rows of LEDs are to be enabled and supplied with power using the VLED lines. Thus, a particular LED in the LED layer 1170 is activated when power (VLED) is supplied on its associated row and the driver current is supplied to its associated column.

While the above description describes an example display device 600 that can incorporate the PLC driver 220, other types of electronic device 100 may similarly utilize the described PLC driver 220. For example, the PLC driver 220 can be utilized for communicating to arrays of sensors, transducers, or other electronic devices.

Upon reading this disclosure, those of skill in the art will appreciate still additional alternative embodiments through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the scope described herein.

What is claimed is:

1. A power line communication driver circuit for driving a power line communication signal, the power line communication driver circuit comprising:
   a ramp generator circuit to receive an input signal encoding digital data and to generate a ramp signal that switches between a low non-zero ramp voltage and a high ramp voltage to encode the digital data, wherein the ramp generator controls an ascending slew rate of transitions from the low non-zero ramp voltage to the high ramp voltage according to a first current control signal, and the ramp generator controls a descending slew rate of transitions from the high ramp voltage to the low non-zero ramp voltage according to a second current control signal; and
   a buffer circuit to receive the ramp signal and to buffer the ramp signal to generate the power line communication signal that provide a power supply voltage to drive one or more electronic devices and provides the digital data controlling the one or more electronic devices.

2. The power line communication driver circuit of claim 1, wherein the ramp generator circuit comprises:
   a capacitor;
   a controlled current circuit to receive the input signal, the first current control signal, and the second current control signal, and to cause charging of the capacitor in response to the input signal having a first input voltage level, and to cause discharging of the capacitor in response to the input signal having a second input voltage level;
   a clamping circuit to clamp the voltage across the capacitor between the low non-zero ramp voltage and the high ramp voltage; and
   an output node to output the voltage across the capacitor.

3. The power line communication driver circuit of claim 2, wherein the clamping circuit comprises:
   a first transistor coupled between a supply voltage and the output node;
   a second transistor coupled between the output node and ground;
   a first voltage source to provide a low voltage controlling the low non-zero ramp voltage;
   a second voltage source to provide a high voltage controlling the high ramp voltage;
   a first amplifier to control the first transistor to source current from the supply voltage to the output node when the voltage at the output node is less than the low voltage and to control the first transistor to prevent the current from flowing from the supply voltage when the voltage at the output node exceeds the low voltage; and
   a second amplifier to control the second transistor to sink current from the output node to ground when the voltage at the output node is greater than the high voltage and to control the second transistor to prevent the current from flowing to ground when the voltage at the output node is below the high voltage.

4. The power line communication driver circuit of claim 1, wherein the controlled current circuit comprises:
   a first current source to source a first current controlled by the first current control signal to charge the capacitor according to the ascending slew rate when outputting the high ramp voltage; and
   a second current source to sink a second current controlled by the second current control signal to discharge the capacitor according to the descending slew rate when outputting the low non-zero ramp voltage.

5. The power line communication driver circuit of claim 4, wherein the controlled current circuit further comprises:
   a first switch to activate the first current source when the input signal has a first logic level and to deactivate the first current source when the input signal has a second logic level; and
   a second switch to activate the second current source when the input signal has the second logic level and to deactivate the second current source when the input signal has the first logic level.

6. The power line communication driver circuit of claim 4, wherein the controlled current circuit comprises:
   a jitter control circuit to generate the first and second current control signals as time varying signals that cause the first current source and the second current source to vary the first current and the second current respectively based on a control waveform.

7. The power line communication driver circuit of claim 6, wherein the jitter control circuit comprises:
   a waveform generator to generate a voltage waveform; and
   a voltage-to-current converter to convert the voltage waveform to the first current control signal and the second current control signal, wherein the second current control signal is inverted relative to the first current control signal.

8. The power line communication driver circuit of claim 7, wherein the voltage-to-current convert comprises:
   an amplifier to generate a current waveform based on the voltage waveform; and
   a current mirror circuit to mirror the current waveform to generate the first current control signal, and to inversely mirror the current waveform to generate the second current control signal.

9. The power line communication driver circuit of claim 1, wherein the first and second current control signals cause the ascending and descending slew rates to vary according to a triangle waveform.

10. The power line communication driver circuit of claim 1, wherein the first and second current control signals cause the ascending and descending slew rates to vary according to a periodic waveform.

11. The power line communication driver circuit of claim 1, wherein the first and second current control signals cause the ascending and descending slew rates to vary according to a non-periodic waveform.

12. A display device comprising:
   an array of LED zones each comprising one or more LEDs;
   a set of power communication lines;
   an array of distributed driver circuits to each control one or more of the LED zones, the array of distributed driving circuits arranged in groups, each group coupled to one of the set of power communication lines to receive a respective power line communication signal that supplies power to the driver circuits in the group and provides control data to the driver circuits in the group;
   a control circuit including a plurality of power line communication driver circuits for driving the set of power communication lines, each of the power line communication driver circuits comprising:
      a ramp generator circuit to receive an input signal encoding digital data and to generate a ramp signal that switches between a low non-zero ramp voltage and a high ramp voltage to encode the digital data; and a buffer circuit to receive the ramp signal and to buffer the ramp signal to generate the power line communication signal.

13. The display device of claim 12, wherein the ramp generator controls an ascending slew rate of transitions from the low non-zero ramp voltage to the high ramp voltage according to a first current control signal, and the ramp generator controls a descending slew rate of transitions from the high ramp voltage to the low non-zero ramp voltage according to a second current control signal.

14. The display device of claim 13, wherein the ramp generator circuit comprises:
   a capacitor;
   a controlled current circuit to receive the input signal, the first current control signal, and the second current control signal, and to cause charging of the capacitor in response to the input signal having a first input voltage level, and to cause discharging of the capacitor in response to the input signal having a second input voltage level;
   a clamping circuit to clamp the voltage across the capacitor between the low non-zero ramp voltage and the high ramp voltage; and
   an output node to output the voltage across the capacitor.

15. The display device of claim 13, wherein the first and second current control signals cause the ascending and descending slew rates to vary according to a triangle waveform.

16. The display device of claim 12, wherein the one or more LEDs in an LED zone and the driver circuit that controls the one or more LEDs in the LED zone are integrated and vertically stacked over a substrate.

17. A control circuit for controlling groups of distributed zone integrated circuits each comprising one or more LEDs and a driver circuit for driving the one or more LEDs, the control circuit comprising:
   a timing controller to receive image data and to generate a plurality of timing signals each corresponding to one of the groups of distributed zone integrated circuits;
   a plurality of power line communication driver circuits, each of the plurality of power line communication driver circuits to receive one of the timing signals and to generate a power line communication signal to drive a power communication line coupled to one of the groups of distributed zone integrated circuits, the power line communication signal to supply power to the zone integrated circuits and to provide control data to the zone integrated circuits, each of the plurality of power line communication driver circuits comprising:
   a ramp generator circuit to receive the timing signal and to generate a ramp signal that switches between a low non-zero ramp voltage and a high ramp voltage to encode digital data of the timing signal; and
   a buffer circuit to receive the ramp signal and to buffer the ramp signal to generate the power line communication signal.

18. The control circuit of claim 17, wherein the ramp generator controls an ascending slew rate of transitions from the low non-zero ramp voltage to the high ramp voltage according to a first current control signal, and the ramp generator controls a descending slew rate of transitions from the high ramp voltage to the low non-zero ramp voltage according to a second current control signal.

19. The control circuit of claim 18, wherein the ramp generator circuit comprises:
   a capacitor;
   a controlled current circuit to receive the timing signal, the first current control signal, and the second current control signal, and to cause charging of the capacitor in response to the timing signal having a first input voltage level, and to cause discharging of the capacitor in response to the timing signal having a second input voltage level;
   a clamping circuit to clamp the voltage across the capacitor between the low non-zero ramp voltage and the high ramp voltage; and
   an output node to output the voltage across the capacitor.

20. The control circuit of claim 18, wherein the first and second current control signals cause the ascending and descending slew rates to vary according to a triangle waveform.

* * * * *